(12) United States Patent
Jeong et al.

(10) Patent No.: US 12,356,846 B2
(45) Date of Patent: Jul. 8, 2025

(54) ORGANIC LIGHT-EMITTING DISPLAY DEVICE, AND METHOD FOR MANUFACTURING ORGANIC LIGHT-EMITTING DISPLAY DEVICE

(71) Applicant: SAMSUNG DISPLAY CO., LTD., Yongin-si (KR)

(72) Inventors: Se Hoon Jeong, Yongin-si (KR); Sung Hun Key, Yongin-si (KR); Jae Sik Kim, Yongin-si (KR); Jae Ik Kim, Yongin-si (KR); Yeon Hwa Lee, Yongin-si (KR); Joon Gu Lee, Yongin-si (KR); Choel Min Jang, Yongin-si (KR); Eun Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 822 days.

(21) Appl. No.: 17/414,649

(22) PCT Filed: May 23, 2019

(86) PCT No.: PCT/KR2019/006170
§ 371 (c)(1),
(2) Date: Jun. 16, 2021

(87) PCT Pub. No.: WO2020/130244
PCT Pub. Date: Jun. 25, 2020

(65) Prior Publication Data
US 2022/0052267 A1    Feb. 17, 2022

(30) Foreign Application Priority Data
Dec. 17, 2018    (KR) .................. 10-2018-0163307

(51) Int. Cl.
*H01L 33/00* (2010.01)
*H10K 50/844* (2023.01)
(Continued)

(52) U.S. Cl.
CPC ......... *H10K 71/221* (2023.02); *H10K 50/844* (2023.02); *H10K 59/122* (2023.02);
(Continued)

(58) Field of Classification Search
None
See application file for complete search history.

(56) References Cited

U.S. PATENT DOCUMENTS

| 7,592,635 B2 | 9/2009 | Chung et al. |
| 9,231,211 B2 | 1/2016 | Lee et al. |

(Continued)

FOREIGN PATENT DOCUMENTS

| CN | 107516665 A | 12/2017 |
| CN | 107680985 A | 2/2018 |

(Continued)

OTHER PUBLICATIONS

International Search Report for Application No. PCT/KR2019/006170 mailed on Sep. 10, 2019.
(Continued)

*Primary Examiner* — Bradley Smith
(74) *Attorney, Agent, or Firm* — CANTOR COLBURN LLP

(57) ABSTRACT

A method of manufacturing an organic light-emitting display apparatus includes forming a pixel electrode and a pixel-defining layer on a substrate, the pixel-defining layer covering edges of the pixel electrode sequentially forming a lift-off layer and a photoresist on the pixel electrode and the pixel-defining layer patterning the lift-off layer and the photoresist to define an opening that exposes a top surface (Continued)

of the pixel electrode and a portion of the pixel-defining layer sequentially forming an intermediate layer and an opposite electrode in the opening and on the photoresist, the intermediate layer including an emission layer forming a passivation layer to cover an entirety of a top surface and end portions of the opposite electrode and removing the lift-off layer and the photoresist that remain outside the opening.

25 Claims, 17 Drawing Sheets

(51) Int. Cl.
    *H10K 59/122* (2023.01)
    *H10K 71/00* (2023.01)
    *H10K 71/20* (2023.01)
    *H10K 50/11* (2023.01)
    *H10K 50/824* (2023.01)
    *H10K 59/12* (2023.01)
    *H10K 59/80* (2023.01)

(52) U.S. Cl.
    CPC .......... *H10K 71/00* (2023.02); *H10K 71/621* (2023.02); *H10K 50/11* (2023.02); *H10K 50/824* (2023.02); *H10K 59/1201* (2023.02); *H10K 59/80522* (2023.02); *H10K 59/873* (2023.02)

(56) References Cited

U.S. PATENT DOCUMENTS

| | | | |
|---|---|---|---|
| 10,090,484 B1 | 10/2018 | Kwon et al. | |
| 10,134,991 B2 | 11/2018 | Choi et al. | |
| 10,374,020 B2 | 8/2019 | Kang | |
| 10,403,853 B2 | 9/2019 | Choung et al. | |
| 10,424,627 B2 | 9/2019 | Lee et al. | |
| 10,566,396 B2 | 2/2020 | Lee et al. | |
| 10,693,068 B2 | 6/2020 | Lee et al. | |
| 2002/0014836 A1 | 2/2002 | Codama et al. | |
| 2005/0159010 A1* | 7/2005 | Bhardwaj | H01J 37/32623 438/714 |
| 2006/0043599 A1* | 3/2006 | Akram | H01L 21/6835 257/E21.597 |
| 2010/0102715 A1 | 4/2010 | Suh | |
| 2014/0145152 A1 | 5/2014 | Chung et al. | |
| 2015/0034930 A1* | 2/2015 | Reusch | H10K 50/818 257/40 |
| 2016/0043341 A1* | 2/2016 | Heo | H10K 59/122 438/23 |
| 2016/0086802 A1* | 3/2016 | Hong | H01L 29/78693 438/104 |
| 2017/0084643 A1* | 3/2017 | Saraf | H01L 21/02164 |
| 2017/0365812 A1* | 12/2017 | Choung | H10K 59/131 |

FOREIGN PATENT DOCUMENTS

| | | |
|---|---|---|
| CN | 108074953 A | 5/2018 |
| JP | 2001284734 A | 10/2001 |
| JP | 3302262 B2 | 4/2002 |
| KR | 100864001 B1 | 10/2008 |
| KR | 100971751 B1 | 7/2010 |
| KR | 1020150063841 A | 6/2015 |
| KR | 1020170102145 A | 9/2017 |
| KR | 1020170137977 A | 12/2017 |
| KR | 1020170142231 A | 12/2017 |
| KR | 1020180014895 A | 2/2018 |
| KR | 1020180054983 A | 5/2018 |
| KR | 1020180104227 A | 9/2018 |
| KR | 1020180121757 A | 11/2018 |

OTHER PUBLICATIONS

Written Opinion for Application No. PCT/KR2019/006170 mailed on Sep. 10, 2019.
Chinese Office Action dated Jan. 4, 2024 issued in Chinese Patent Application No. 201980083789.2 (partial translation) (7 pages).

* cited by examiner

ORGANIC LIGHT-EMITTING DISPLAY DEVICE, AND METHOD FOR MANUFACTURING ORGANIC LIGHT-EMITTING DISPLAY DEVICE

This application is a national stage application of International Patent Application No. PCT/KR2019/006170, filed on May 23, 2019, which claims priority to Korean Patent Application No. 10-2018-0163307, filed on Dec. 17, 2018, and all the benefits accruing therefrom under 35 U.S.C. § 119, the content of which in their entirety is herein incorporated by reference.

BACKGROUND

1. Field

Embodiments of the invention relate to an organic light-emitting display apparatus and a method of manufacturing the organic light-emitting display apparatus, and more particularly, to an organic light-emitting display apparatus and a method of manufacturing the organic light-emitting display apparatus via a simplified process to have a reduced number of defects.

2. Description of the Related Art

An organic light-emitting display apparatus includes an organic light-emitting element including a hole injection electrode, an electron injection electrode, and an organic emission layer therebetween. The organic light-emitting display apparatus is a self-luminous display apparatus in which light is emitted by excitons falling from an excited state to a ground state after the excitons are generated when holes injected from the hole injection electrode and electrons injected from the electron injection electrode combine with each other in the organic emission layer.

SUMMARY

Though a fine metal mask ("FMM") may be used as a technology for depositing an organic emission layer on a substrate, there is limitation in manufacturing an organic light-emitting display apparatus of high resolution due to a shadow effect of the metal mask. Accordingly, an alternative deposition technology is desired.

Provided are an organic light-emitting display apparatus and a method of manufacturing an organic light-emitting display apparatus which via a simplified process to have a reduced number of defects. However, such a technical problem is an example, and the invention is not limited thereto.

In an embodiment of the invention, a method of manufacturing an organic light-emitting display apparatus includes forming a pixel electrode and a pixel-defining layer on a substrate such that the pixel-defining layer covers edges of the pixel electrode, sequentially forming a lift-off layer and a photoresist on the pixel electrode and the pixel-defining layer, patterning the lift-off layer and the photoresist to define an opening that exposes a first surface of the pixel electrode and a portion of the pixel-defining layer, the first surface of the pixel electrode being opposite to a second surface of the pixel electrode facing the substrate, sequentially forming an intermediate layer and an opposite electrode in the opening and on the photoresist, the intermediate layer including an emission layer, forming a passivation layer to cover an entirety of a first surface and end portions of the opposite electrode, the first surface of the opposite electrode being opposite to a second surface of the opposite electrode facing the substrate, and removing the lift-off layer and the photoresist that remain outside the opening.

In an embodiment, the photoresist may be patterned through a photolithography process.

In an embodiment, the lift-off layer may include a fluoropolymer.

In an embodiment, the opening may be defined by etching the lift-off layer using a first solvent including fluorine.

In an embodiment, the intermediate layer may be provided through a first deposition process, the opposite electrode may be provided through a second deposition process, and the passivation layer may be provided through a third deposition process that may make step coverage greater than step coverage over the intermediate layer and the opposite electrode.

In an embodiment, the first deposition process may use a physical vapor deposition process.

In an embodiment, the second deposition process may use a physical vapor deposition process.

In an embodiment, the third deposition process may use a chemical vapor deposition process or an atomic layer deposition process.

In an embodiment, the first to third deposition processes may be performed in a same chamber.

In an embodiment, after the third deposition process, dry etching may be performed inside a same chamber as a chamber in which the third deposition process is performed.

In an embodiment, a first surface of the pixel-defining layer opposite to a second surface of the pixel-defining layer facing the substrate may be exposed through the dry etching.

In an embodiment, the method may further include forming an auxiliary electrode on the pixel-defining layer, where the opposite electrode may contact the auxiliary electrode.

In an embodiment, after the forming the passivation layer, dry etching may be performed in a same chamber as a chamber in which the passivation layer is provided, and a first surface of the auxiliary electrode opposite to a second surface of the auxiliary electrode facing the substrate may be exposed through the dry etching.

In an embodiment, the lift-off layer that remains may be removed by a second solvent including fluorine.

In an embodiment, the removing the lift-off layer may be performed in atmosphere.

In an embodiment of the invention, a method of manufacturing an organic light-emitting display apparatus includes after forming first and second pixel electrodes on a substrate and forming a pixel-defining layer that covers end portions of the first and second pixel electrodes, performing a first unit operation including sequentially forming a first lift-off layer and a first photoresist on the first and second pixel electrodes and the pixel-defining layer, patterning the first lift-off layer and the first photoresist to form a first opening that exposes a first surface of the first pixel electrode and a portion of the pixel-defining layer, the first surface of the first pixel electrode being opposite to a second surface of the first pixel electrode facing the substrate, sequentially forming a first intermediate layer and a first opposite electrode in the first opening and on the first photoresist, the first intermediate layer including a first emission layer, forming a first passivation layer to cover a first surface and end portions of the first opposite electrode, the first surface of the first opposite electrode being opposite to a second surface of the first opposite electrode facing the substrate, and removing the first lift-off layer and the first photoresist that remain outside the first opening, and after the first unit operation, performing a second unit operation including sequentially forming a second lift-off layer and a second photoresist on the first passivation layer, the second pixel electrode, and the pixel-defining layer, patterning the second lift-off layer and the second photoresist to define a second opening that exposes a first surface of the second pixel electrode and a portion of the pixel-defining layer, the first surface of the second pixel electrode being opposite to a second surface of the second pixel electrode facing the substrate, sequentially forming a second intermediate layer and a second opposite electrode in the second opening and on the second photoresist, the second intermediate layer including a second emission layer, forming a second passivation layer to cover an entirety of a first surface and end portions of the second opposite electrode, the first surface of the second opposite electrode being opposite to a second surface of the second opposite electrode facing the substrate, and removing the second lift-off layer and the second photoresist that remain outside the second opening.

In an embodiment, a color emitted from the first emission layer may be different from a color emitted from the second emission layer.

In an embodiment, the first intermediate layer, the first opposite electrode, and the first passivation layer may be provided in a first chamber.

In an embodiment, the method may include after the forming the first passivation layer, performing etching in a first chamber.

In an embodiment, the method may include forming the second intermediate layer, the second opposite electrode, and the second passivation layer in a second chamber different from the first chamber.

In an embodiment, the method may include after the second passivation layer is provided, performing dry etching in the second chamber.

In an embodiment, the intermediate layer may further include at least one of a hole injection layer, a hole transport layer, an electron transport layer, and an electron injection layer.

In an embodiment, the method may further include forming an encapsulation member sequentially arranged on the first passivation layer and the second passivation layer and including at least one organic layer and at least one inorganic layer.

According to an feature of the invention, an organic light-emitting display apparatus includes first and second pixel electrodes apart from each other on a substrate, a pixel-defining layer covering end portions of the first and second pixel electrodes, first and second intermediate layers respectively including first and second emission layers arranged as islands on the first and second pixel electrodes, first and second opposite electrodes respectively arranged in island patterns on the first and second intermediate layers, first and second passivation layers respectively arranged in island patterns on the first and second opposite electrodes and covering an entirety of the first and second opposite electrodes, and an encapsulation member covering the first and second passivation layers.

In an embodiment, the first passivation layer and the second passivation layer may each include a nitride-based material.

In an embodiment, because an intermediate layer including an emission layer is provided through a lift-off process instead of using a fine metal mask, a misalignment issue of the fine metal mask may be prevented and a manufacturing cost may be reduced.

In addition, in an embodiment, a passivation layer is provided through a vapor deposition method having excellent step coverage, and thus, an entirety of an opposite electrode is covered. Accordingly, a defect of a light-emitting element may be reduced.

In addition, in an embodiment, a portion of a passivation layer is dry-etched in a deposition chamber, and thus, an opposite electrode is prevented from being exposed to atmosphere. Accordingly, a defect of a light-emitting element may be reduced.

The scope of the invention is not limited by the above effects.

BRIEF DESCRIPTION OF DRAWINGS

The above and other embodiments, advantages and features of this disclosure will become more apparent by describing in further detail embodiments thereof with reference to the accompanying drawings.

DETAILED DESCRIPTION

Figure 1:
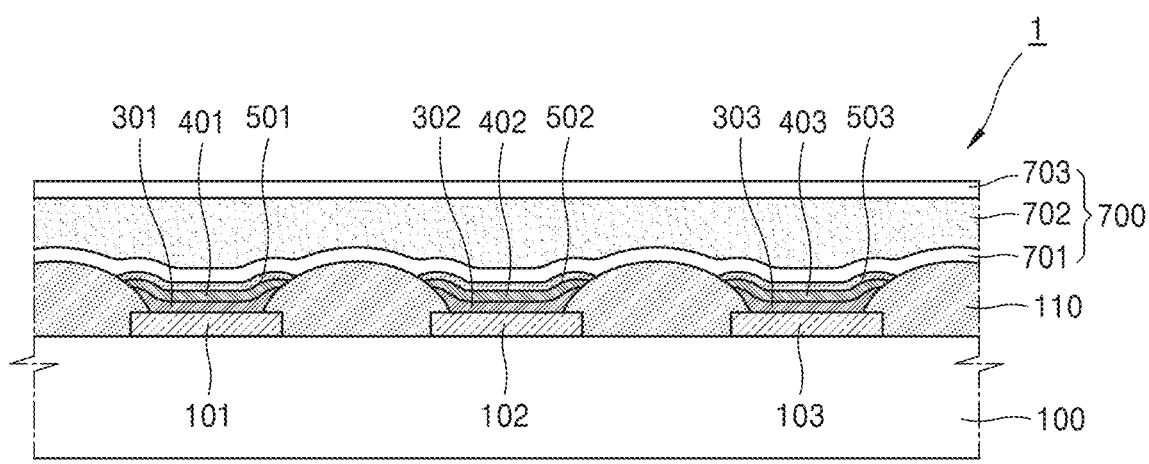
FIG. 1 is a cross-sectional view of an embodiment of an organic light-emitting display apparatus.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, where like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. For example, since sizes and thicknesses of elements in the drawings are arbitrarily illustrated for convenience of explanation, the disclosure is not limited thereto.

When an embodiment may be implemented differently, a certain process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Figure 2:
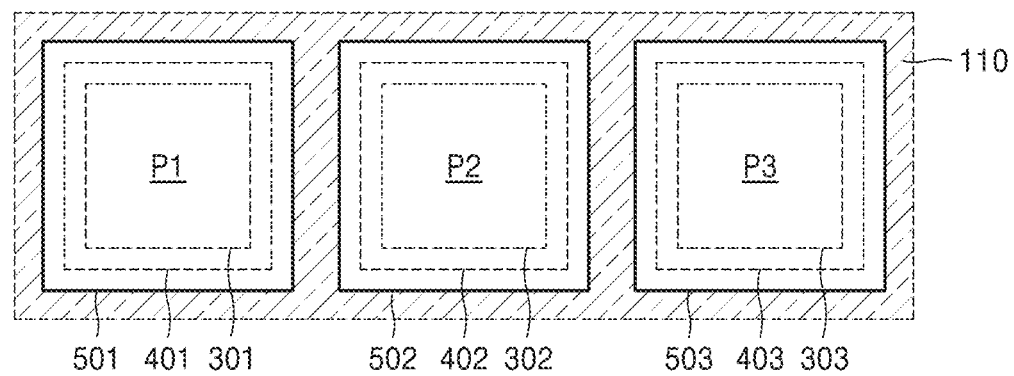
FIG. 2 is a plan view of a portion of FIG. 1.

FIG. 1 is a cross-sectional view of an embodiment of an organic light-emitting display apparatus 1, and FIG. 2 is a plan view of a portion of FIG. 1.

Referring to FIGS. 1 and 2, in the illustrated embodiment of the organic light-emitting display apparatus 1, a plurality of pixel electrodes is apart from each other on a substrate 100. The plurality of pixel electrodes includes a first pixel electrode 101, a second pixel electrode 102, and a third pixel electrode 103.

A pixel-defining layer 110 covers the end portions of the plurality of first to third pixel electrodes 101, 102, and 103, defines an emission area, and prevents electric field concentration to an end portion of each pixel electrode.

First to third intermediate layers 301, 302, and 303 are respectively arranged on the first to third pixel electrodes 101, 102, and 103. The first to third intermediate layers 301, 302, and 303 respectively include first to third emission layers (not shown). First to third opposite electrodes 401, 402, and 403 are respectively arranged on the first to third intermediate layers 301, 302, and 303.

The first to third pixel electrodes 101, 102, and 103, the first to third intermediate layers 301, 302, and 303, and the first to third opposite electrodes 401, 402, and 403 each have an island type pattern. The island type pattern may be a pattern in which a preset region is patterned in an island shape discriminated from another region surrounding the preset region.

In an embodiment, the first to third pixel electrodes 101, 102, and 103, and the first to third intermediate layers 301, 302, and 303 may each be deposited through physical vapor deposition ("PVD"), for example.

First to third passivation layers 501, 502, and 503 each having an island type pattern are respectively arranged on the first to third opposite electrodes 401, 402, and 403.

In an embodiment, the first to third passivation layers 501, 502, and 503 may include a material that may be deposited through chemical vapor deposition ("CVD") or atomic layer deposition ("ALD") which has more excellent step coverage than step coverage through the PVD. In an embodiment, the first to third passivation layers 501, 502, and 503 may include a nitride-based material, for example.

The first to third passivation layers 501, 502, and 503 may each prevent the first to third intermediate layers 301, 302, and 303 and the first to third opposite electrodes 401, 402, and 403 from being deteriorated during a process by covering an entirety of the first to third intermediate layers 301, 302, and 303 and the first to third opposite electrodes 401, 402, and 403. In an embodiment, the areas of the first to third passivation layers 501, 502, and 503 may be greater than the areas of the first to third intermediate layers 301, 302, and 303 and the first to third opposite electrodes 401, 402, and 403.

An encapsulation member 700 may be arranged on the first to third passivation layers 501, 502, and 503. The encapsulation member 700 may include at least one organic layer and at least one inorganic layer. FIG. 1 shows a structure in which a first inorganic layer 701, an organic layer 702, and a second inorganic layer 703 are sequentially stacked.

In an embodiment, the organic layer 702 may include a polymer-based material such as polymethylmethacrylate ("PMMA"), polycarbonate ("PC"), polystyrene ("PS"), an acryl-based resin, an epoxy-based resin, polyimide, or polyethylene.

In an embodiment, the first and second inorganic layers 701 and 703 may include at least one of aluminum nitride (AlN), aluminum oxide ($Al_2O_3$), titanium nitride (TiN), titanium oxide ($TiO_2$), silicon oxynitride (SiON), silicon nitride ($SiN_x$), and silicon oxide ($SiO_x$), for example.

The encapsulation member 700 prevents moisture transmission, and thus, may prevent damage to an organic light-emitting element that is vulnerable to moisture in cooperation with the first to third passivation layers 501, 502, and 503.

The first to third emission layers (not shown) of the first to third intermediate layers 301, 302, and 303 arranged in first to third sub-pixels P1, P2, and P3 may emit light having different colors. In an embodiment, the first sub-pixel P1 may emit red light, the second sub-pixel P2 may emit green light, and the third sub-pixel P3 may emit blue light, for example. However, the invention is not limited thereto, and the first to third sub-pixels P1, P2, and P3 may emit various other colors of light. Though the illustrated embodiment shows the case where three sub-pixels are arranged, an embodiment is not limited thereto.

Hereinafter, a method of manufacturing the organic light-emitting display apparatus 1 and the organic light-emitting display apparatus 1 manufactured by the manufacturing method in the illustrated embodiment are described in detail with reference to FIGS. 3 to 9.

Figure 3:
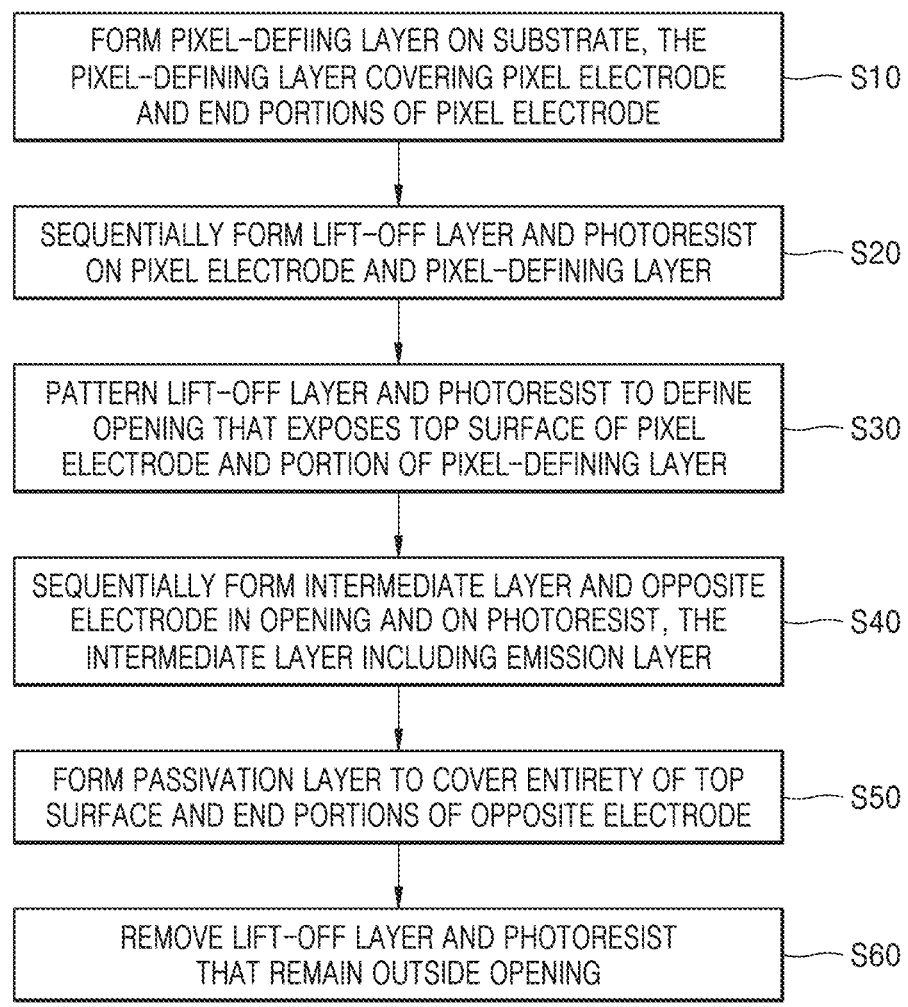
FIG. 3 is a process view showing an embodiment of a method of manufacturing an organic light-emitting display apparatus.
Figure 4:
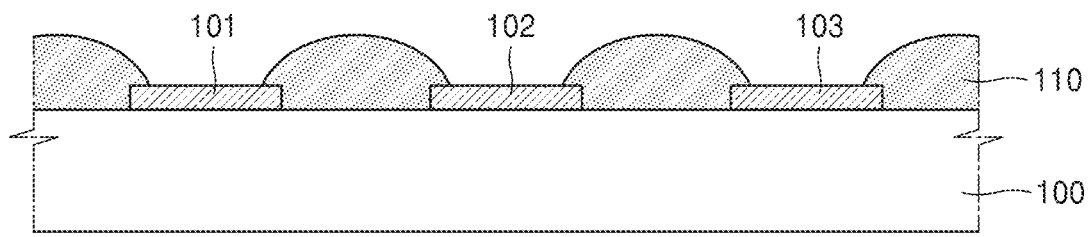
FIG. 4 is a cross-sectional view showing an embodiment of an operation of forming first to third pixel electrodes and a pixel-defining layer on a substrate of an organic light-emitting display apparatus.
Figure 5A:
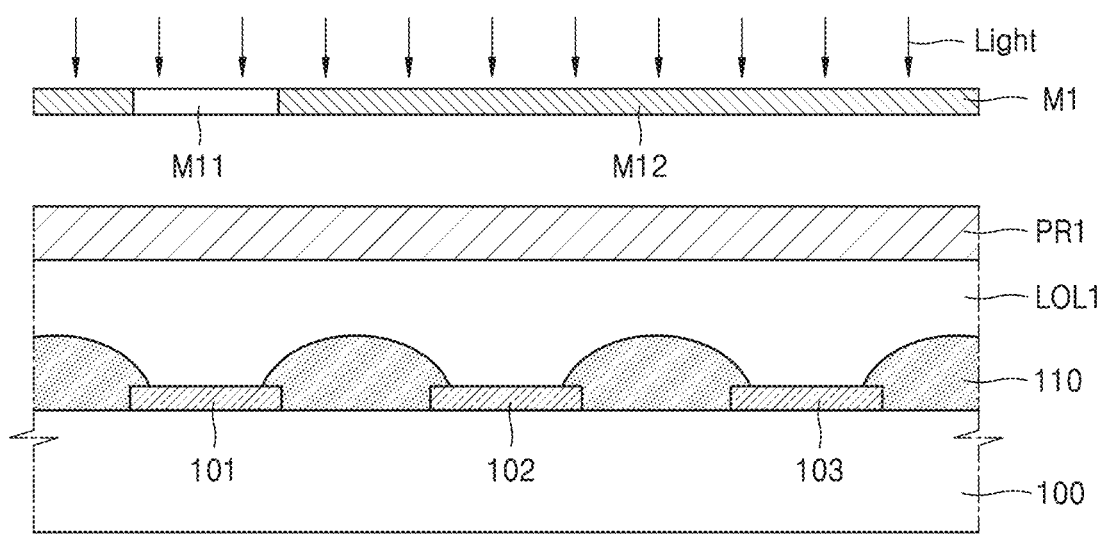
FIGS. 5A to 5F are cross-sectional views showing an embodiment of a first unit process for an organic light-emitting display apparatus.
Figure 5B:
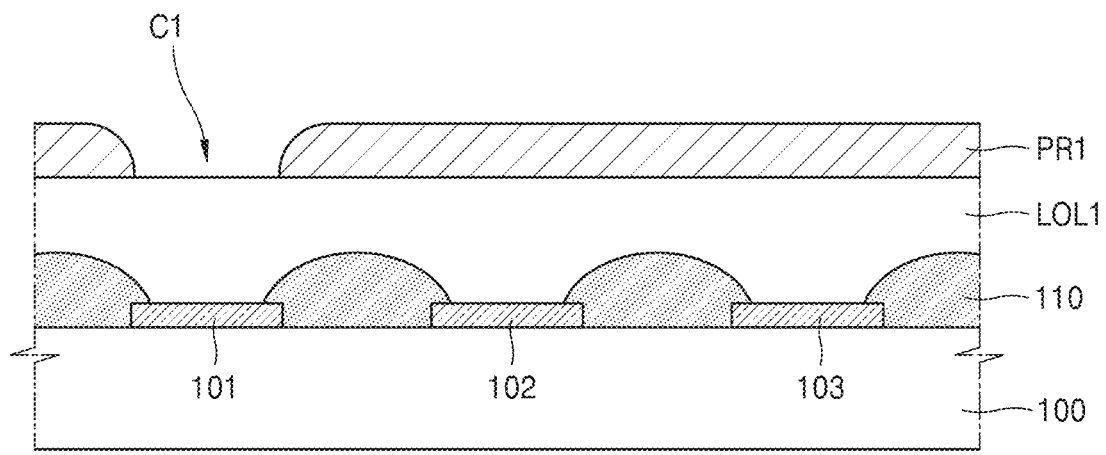
Figure 5C:
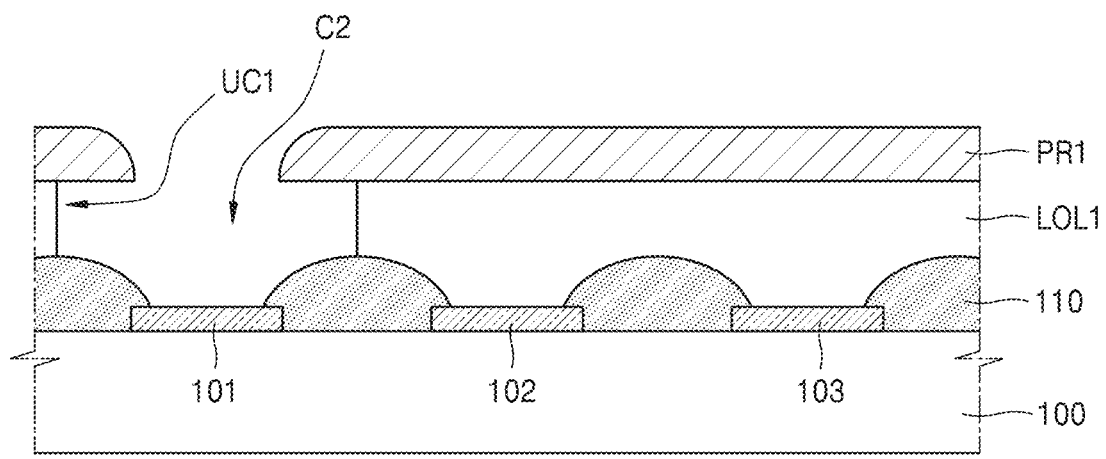
Figure 5D:
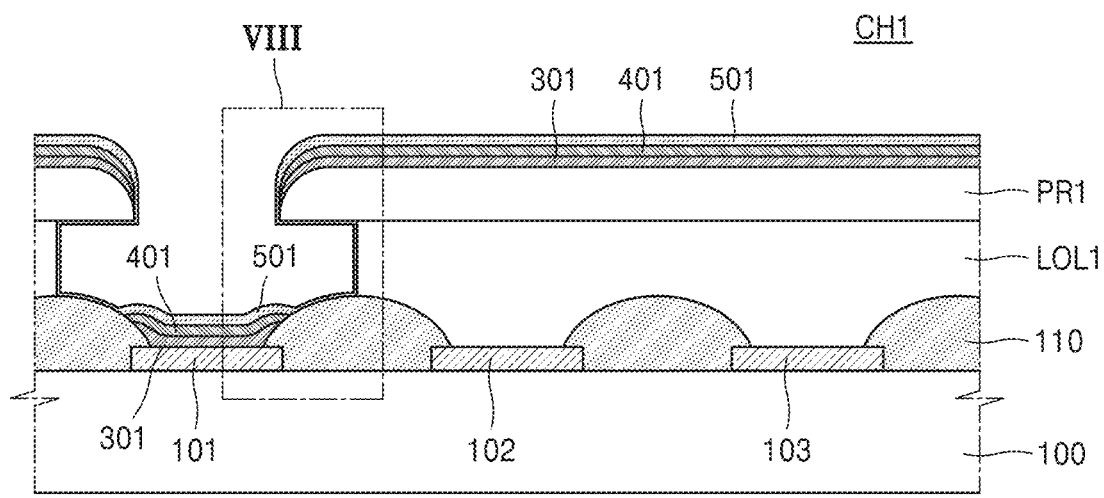
Figure 5E:
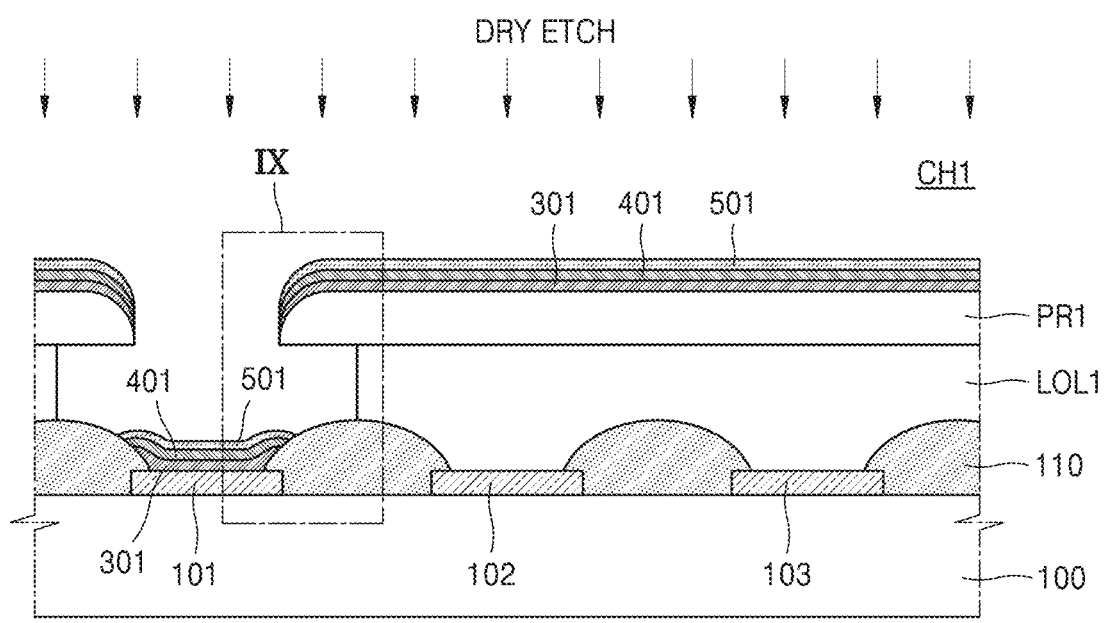
Figure 6A:
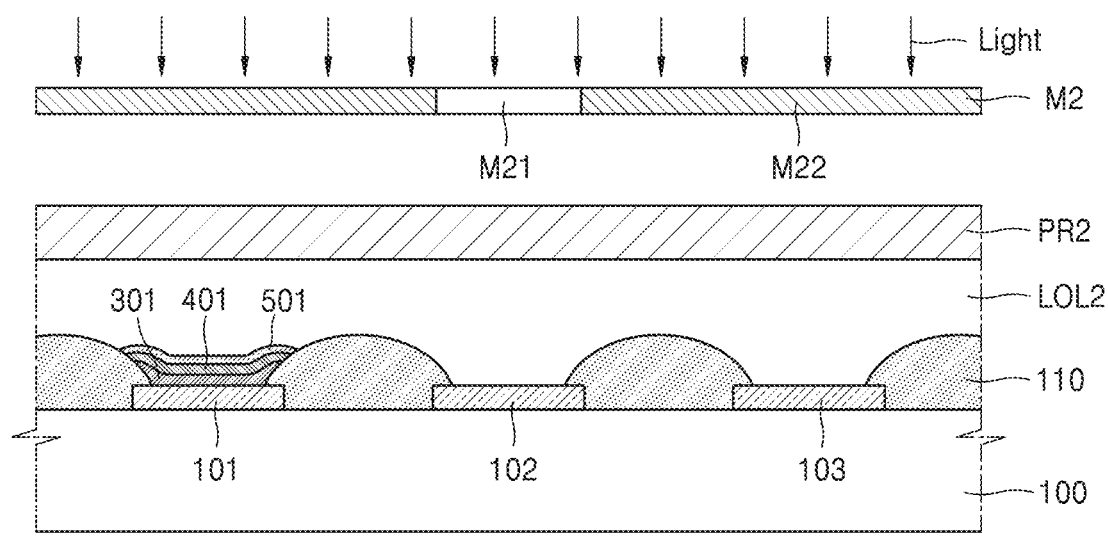
FIGS. 6A to 6F are cross-sectional views showing an embodiment of a second unit process for an organic light-emitting display apparatus.
Figure 6B:
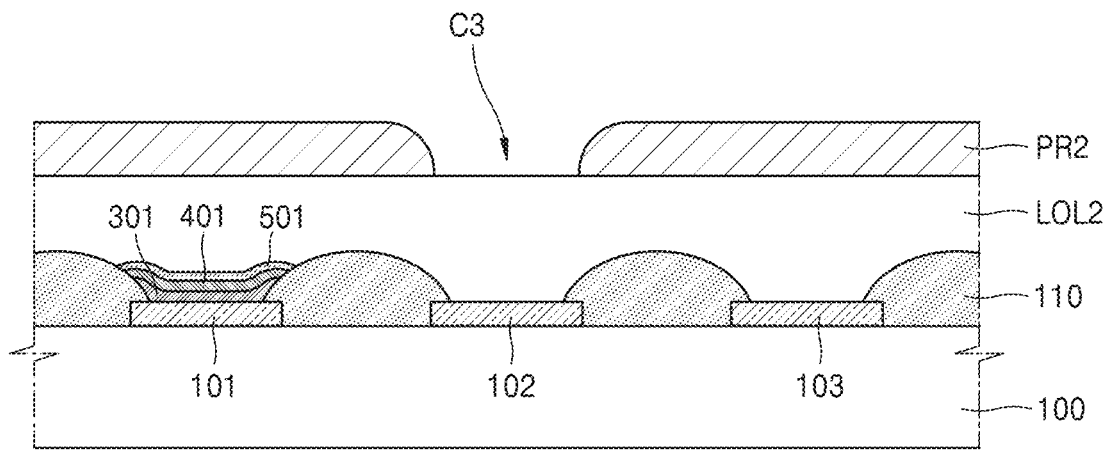
Figure 6C:
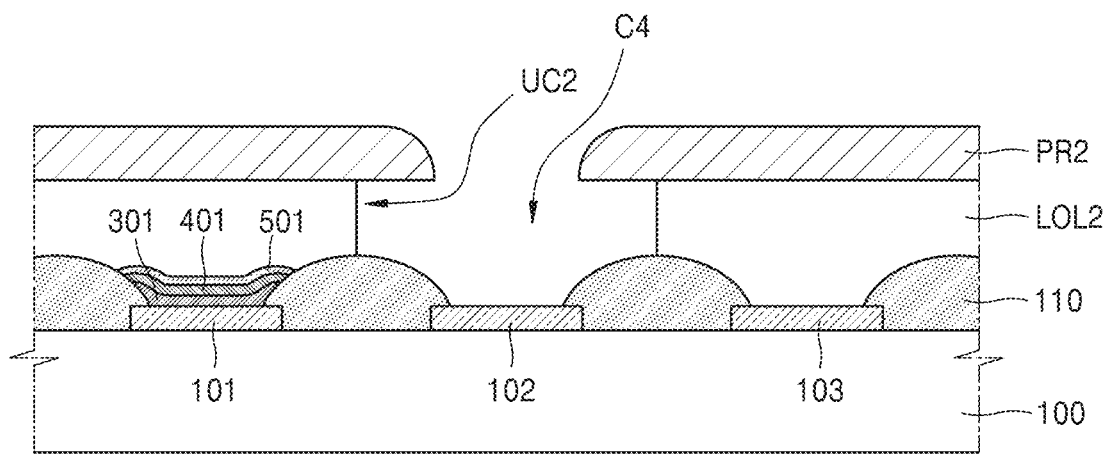
Figure 6D:
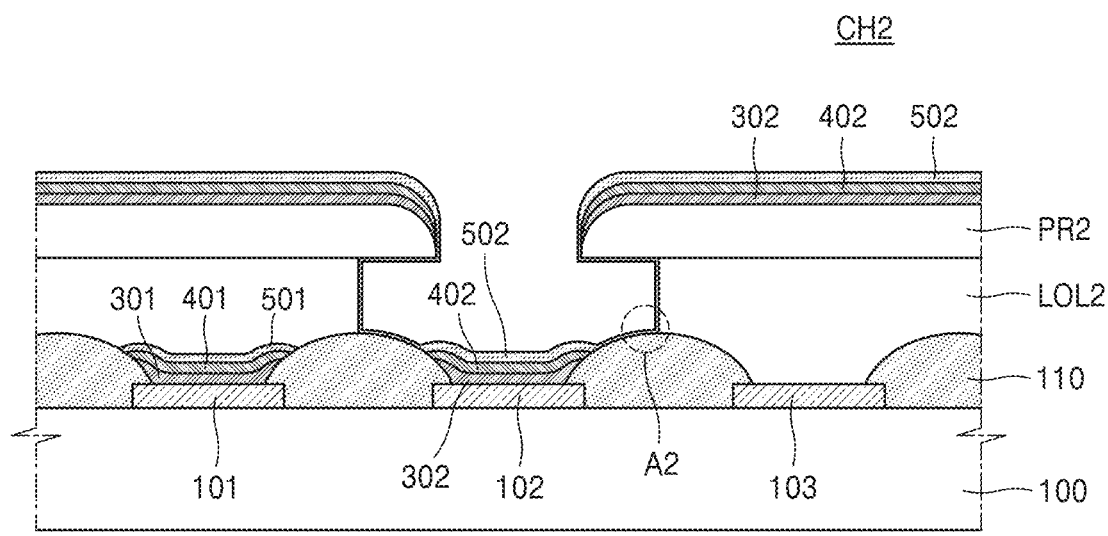
Figure 6E:
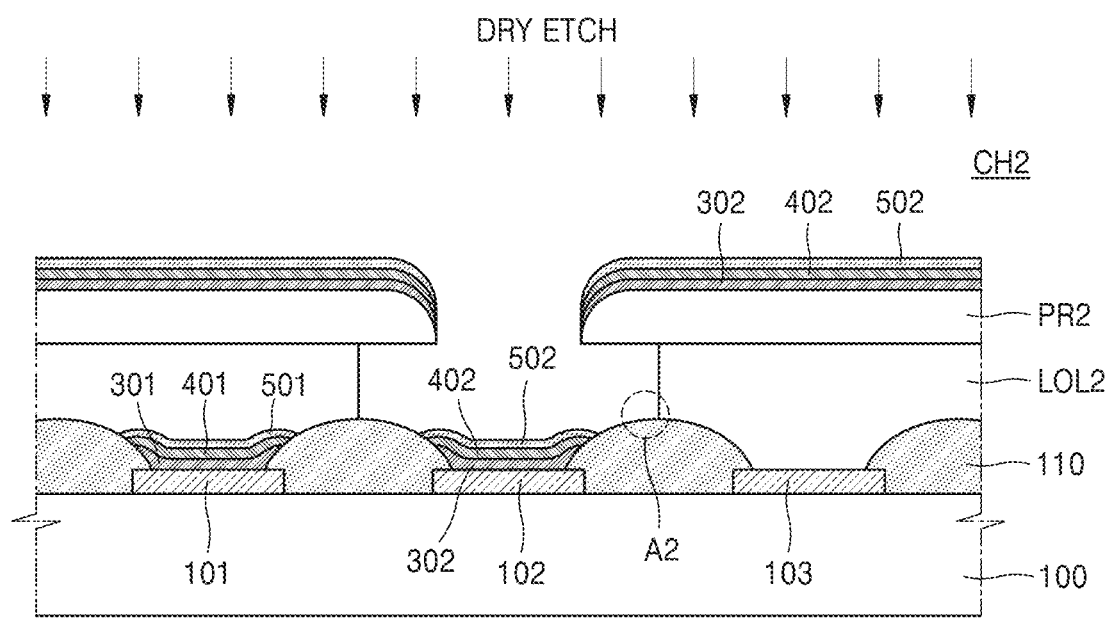
Figure 6F:
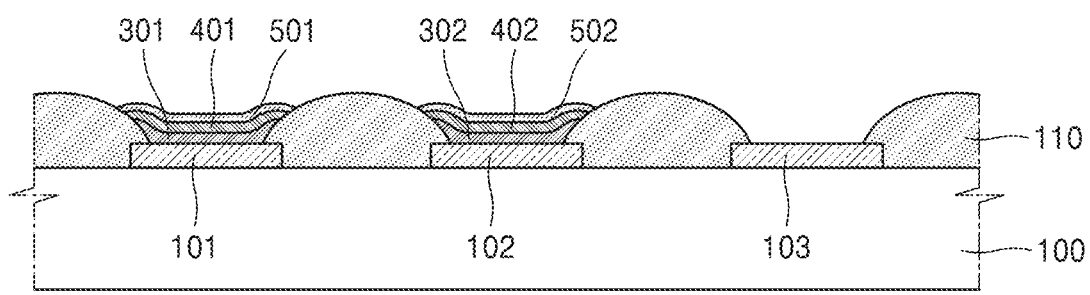
Figure 7A:
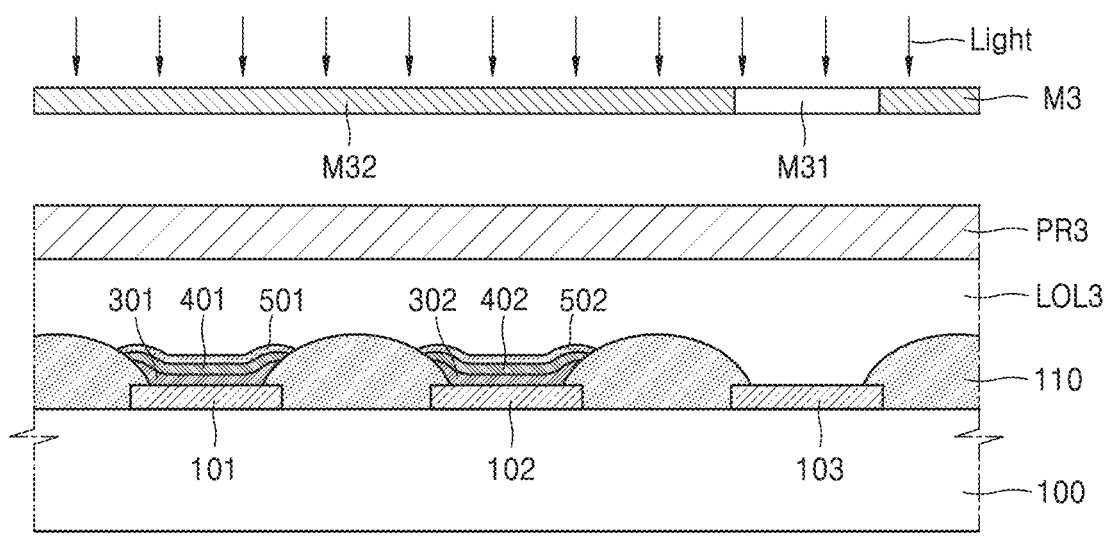
FIGS. 7A to 7F are cross-sectional views showing an embodiment of a third unit process for an organic light-emitting display apparatus.
Figure 7B:
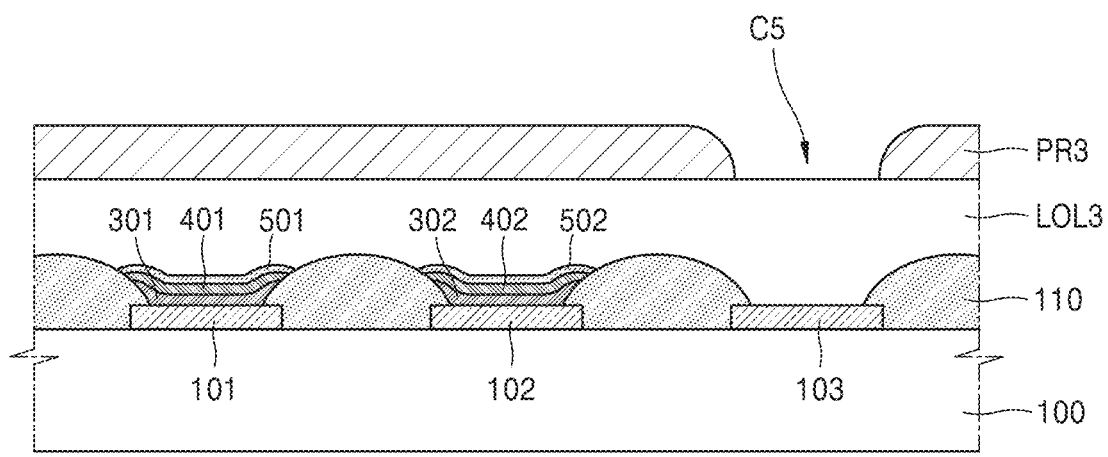
Figure 7C:
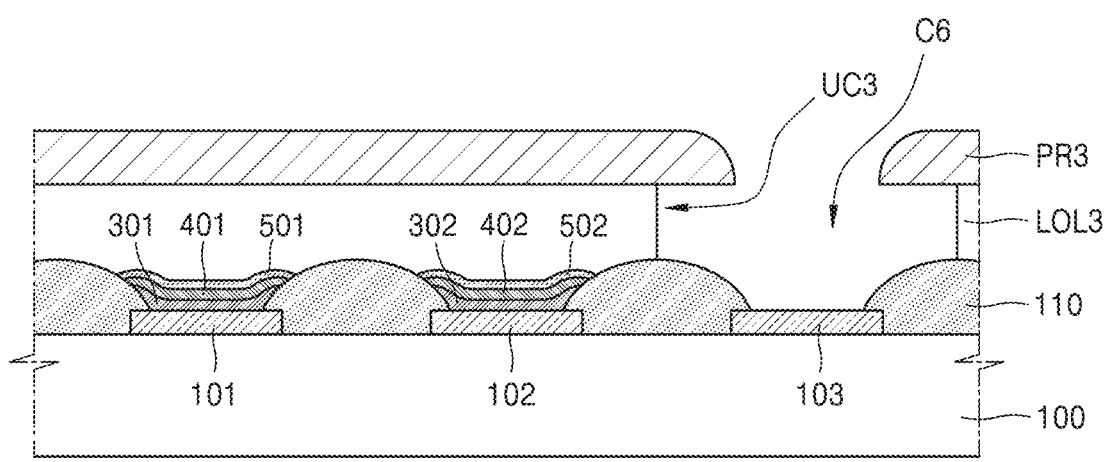
Figure 7D:
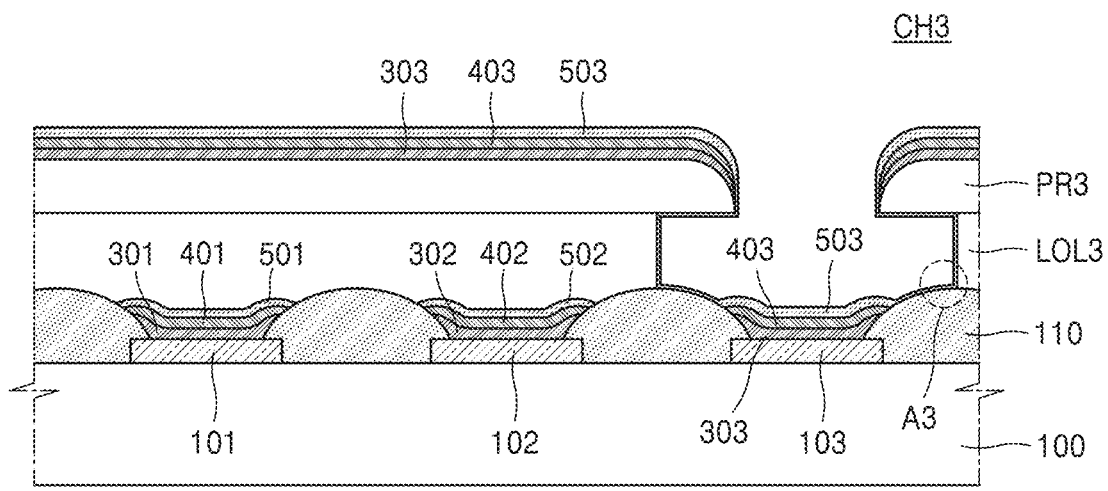
Figure 7E:
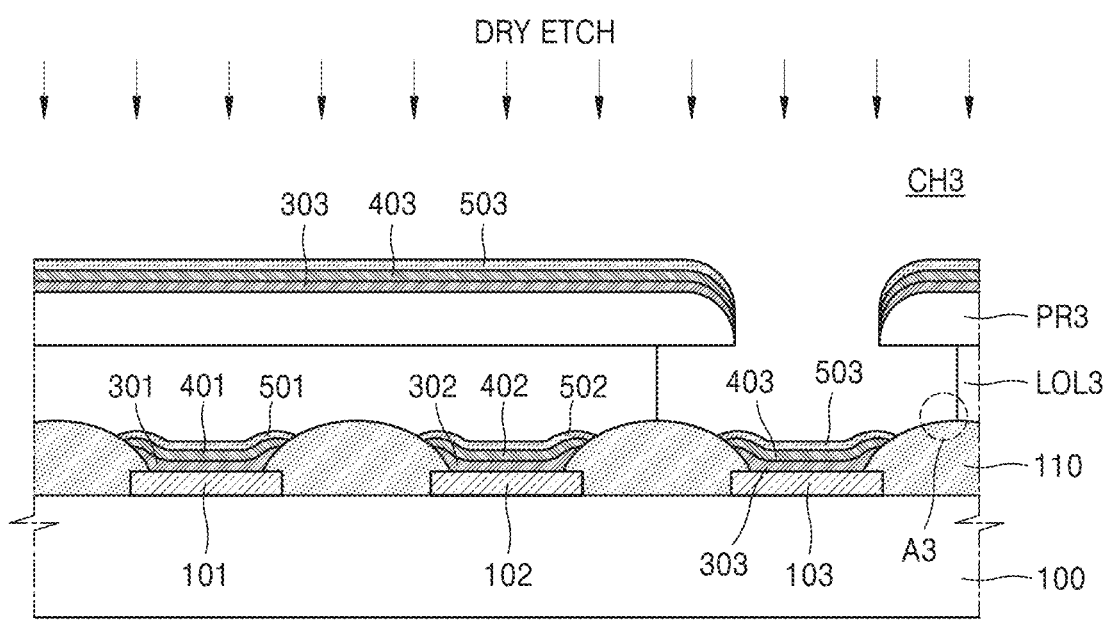
Figure 7F:
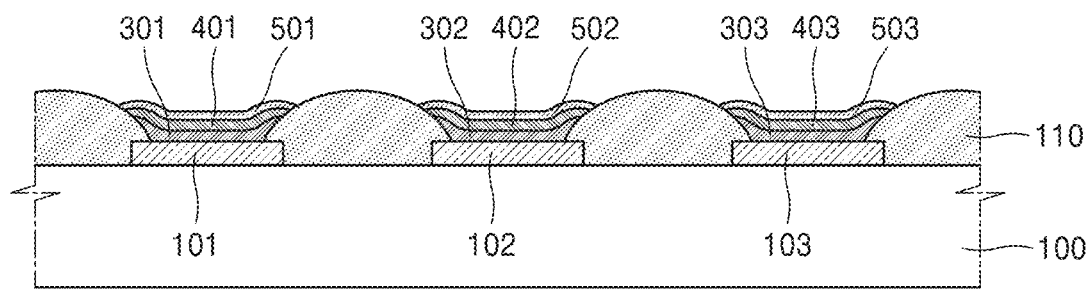
Figure 8:
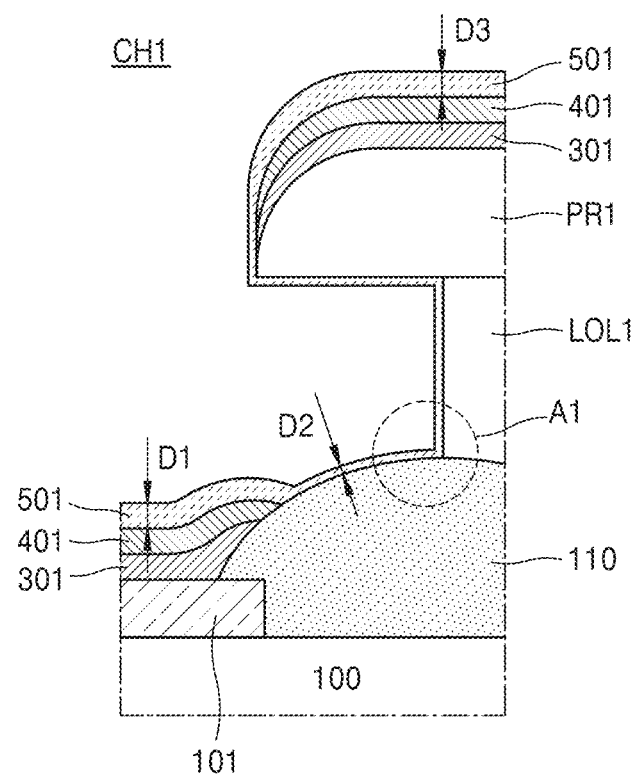
FIG. 8 is an enlarged cross-sectional view of a region VIII of FIG. 5D.
Figure 9:
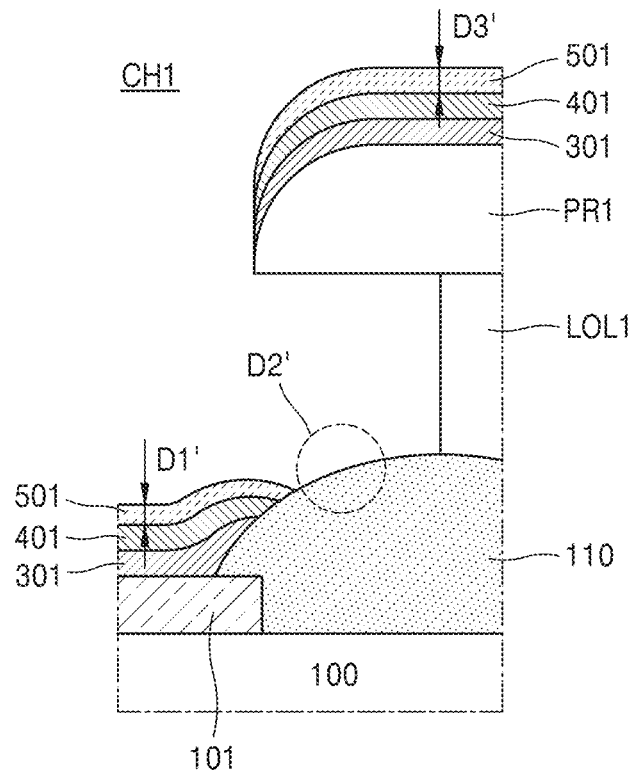
FIG. 9 is an enlarged cross-sectional view of a region IX of FIG. 5E.

FIG. 3 is a process view showing an embodiment of a method of manufacturing the organic light-emitting display apparatus 1, FIG. 4 is a cross-sectional view showing an embodiment of an operation of forming the first to third pixel electrodes 101, 102, and 103 and the pixel-defining layer 110 on the substrate 100 of the organic light-emitting display apparatus 1, FIGS. 5A to 5F are cross-sectional views of an embodiment of a first unit process of the organic light-emitting display apparatus 1, FIGS. 6A to 6F are cross-sectional views of an embodiment of a second unit process of the organic light-emitting display apparatus 1, FIGS. 7A to 7F are cross-sectional views of an embodiment of a third unit process of the organic light-emitting display apparatus 1, FIG. 8 is an enlarged cross-sectional view of a region VIII of FIG. 5D, and FIG. 9 is an enlarged cross-sectional view of a region IX of FIG. 5E.

Referring to FIG. 3, the method of manufacturing the organic light-emitting display apparatus 1 in an embodiment includes forming a pixel electrode and a pixel-defining layer on a substrate, the pixel-defining layer covering the end portions of the pixel electrode (S10), sequentially forming a lift-off layer and a photoresist on the pixel electrode and the pixel-defining layer (S20), defining an opening that exposes the top surface of the pixel electrode and a portion of the pixel-defining layer by patterning the lift-off layer and the photoresist (S30), sequentially forming an intermediate layer and an opposite electrode in the opening and on the photoresist, the intermediate layer including an emission layer (S40), forming a passivation layer to cover an entirety of the top surface and the end portion of the opposite electrode (S50), and removing the lift-off layer and the photoresist that remain outside the opening (S60). Here, the manufacturing method is described with reference to FIGS. 4 to 9.

Referring to FIG. 4, the plurality of pixel electrodes is disposed on the substrate 100, the plurality of pixel electrodes including the first pixel electrode 101, the second pixel electrode 102, and the third pixel electrode 103.

The substrate 100 may be provided by various materials. In an embodiment, the substrate 100 may include glass or plastic. In an embodiment, the plastic may include a material having excellent heat resistance and durability such as polyimide, polyethylene naphthalate, polyethylene terephthalate, polyarylate, polycarbonate, polyetherimide, or poly ethersulfone.

Though not shown in FIG. 4, a flat surface may be provided on the substrate 100, and a buffer layer (not shown) for blocking the penetration of impurity elements may be further provided. In an embodiment, the buffer layer (not shown) may include silicon nitride and/or silicon oxide and include a single layer or a plurality of layers.

The first to third pixel electrodes 101, 102, and 103 may be provided by forming a conductive material layer (not shown) and then patterning the same in an island shaped pattern.

The conductive material layer may include a reflective layer and a transparent conductive oxide layer TCO on or under the reflective layer. The reflective layer may include Mg, Al, Pt, Pd, Au, Ni, Nd, Ir, Cr, or a combination thereof. In an alternative embodiment, the conductive material layer may include a thin layer including Ag or an Al alloy, or include a transparent conductive oxide layer disposed on a thin layer. Depending on the conductive material layer, the first to third pixel electrodes 101, 102, and 103 may be a reflective electrode or a light-transmissive electrode.

The pixel-defining layer 110 is provided by forming an insulating layer (not shown) over the substrate 100 on which the first to third pixel electrodes 101, 102, and 103 have been provided, and patterning the insulating layer. The pixel-defining layer 110 covers the end portions of the first to third pixel electrodes 101, 102, and 103. The pixel-defining layer 110 may include an organic insulating material or an inorganic insulating material.

In an embodiment, the pixel-defining layer 110 may include an organic insulating layer including a general-purpose polymer such as PMMA or PS, an acryl-based polymer, an imide-based polymer, an aryl ether-based polymer, an amide-based polymer, a fluorine-based polymer, a p-xylene-based polymer, a vinyl alcohol-based polymer, or a combination thereof.

Though not shown in FIG. 4, the first to third pixel electrodes 101, 102, and 103 may be electrically connected to first to third thin-film transistors (not shown), respectively, that are arranged between the substrate 100 and the first to third pixel electrodes 101, 102, and 103.

Referring to FIG. 5A, a first lift-off layer LOL1 and a first photoresist PR1 are sequentially disposed on the structure of FIG. 4.

The first lift-off layer LOL1 may include a non-photosensitive organic material. The first lift-off layer LOL1 may include fluoropolymer. In an embodiment, a fluoropolymer included in the first lift-off layer LOL1 may be provided by polymer including fluorine content of about 20 wt % to about 60 wt %. In an embodiment, a fluoropolymer may include at least one of a copolymer with polytetrafluoroethylene, polychlorotrifluoroethylene, polydichlorodifluoroethylene, chlorotrifluoroethylene, and dichlorodifluoroethylene, a copolymer with tetrafluoroethylene and perfluoroalkylvinylether, and a copolymer with chlorotrifluoroethylene and perfluoroalkylvinylether, for example. In an embodiment, the first lift-off layer LOL1 may be provided through methods such as coating, printing, and deposition.

The first photoresist PR1 is disposed on the first lift-off layer LOL1. A portion of the first photoresist PR1 that corresponds to the first pixel electrode 101 is exposed through a first photo mask M1 including a light-transmissive portion M11 and a light-blocking portion M12.

Referring to FIG. 5B, the first photoresist PR1 is developed. The first photoresist PR1 may be one of a positive photoresist and a negative photoresist. In the illustrated embodiment, the first photoresist PR1 as a positive photoresist is described as an example. A first opening C1 corresponding to the first pixel electrode 101 is defined in the developed first photoresist PR1.

Referring to FIG. 5C, the first lift-off layer LOL1 is etched by the patterned first photoresist PR1 of FIG. 5B as an etch mask.

In the case where the first lift-off layer LOL1 includes a fluoropolymer, a solvent that may etch a fluoropolymer is used as an etching liquid. A first solvent may include hydrofluoroether. Hydrofluoroether is an electrochemically stable material due to its low interaction with other materials and is an environmentally stable material due to its low global warming coefficient and low toxicity.

While the first lift-off layer LOL1 is etched during the etching process, a first undercut profile UC1 is disposed under the first opening C1 of the first photoresist PR1, and a second opening C2 that exposes the top surface of the first pixel electrode 101 and a portion of the pixel-defining layer 110 is defined by the first solvent including fluorine. The first undercut profile UC1 is provided, and thus, a wider deposition space may be secured on the first pixel electrode 101.

Referring to FIG. 5D, the first intermediate layer 301, the first opposite electrode 401, and the first passivation layer 501 are disposed on the structure of FIG. 5C. The first intermediate layer 301 includes a first emission layer (not shown).

The first intermediate layer 301, the first opposite electrode 401, and the first passivation layer 501 are provided through vacuum deposition. A deposition source (not shown) is arranged in a first chamber CH1, and deposition is performed by adjusting a deposition incidence angle such that a material emitted from the deposition source (not shown) is incident toward the substrate 100.

The first intermediate layer 301 may further include at least one of a hole injection layer, a hole transport layer, an electron transport layer, and an electron injection layer in addition to the first emission layer (not shown).

The first opposite electrode 401 may be a light-transmissive electrode or a reflective electrode. In an embodiment, the first opposite electrode 401 may be a metal thin film or a metal thick layer including at least one of Ag, Mg, Al, Yb, Ca, Li, and Au, for example. The first opposite electrode 401 covers the first intermediate layer 301, and thus, may serve as a protective layer that protects the first intermediate layer 301 that is vulnerable to moisture and oxygen.

The first intermediate layer 301 and the first opposite electrode 401 are deposited on the top surface of the first pixel electrode 101 and a portion of the ends of the pixel-defining layer 110 arranged in the second opening C2, and are stacked also on the first photoresist PR1.

The first intermediate layer 301 and the first opposite electrode 401 may be deposited through the PVD. In an embodiment, the first intermediate layer 301 may be deposited in the first chamber CH1 through one of sputtering, thermal evaporation, E-beam evaporation, laser molecular beam epitaxy, and pulsed laser deposition. The first opposite electrode 401 covers the first intermediate layer 301 by adjusting a deposition incidence angle, a chamber pressure, temperature, a reaction gas, etc., in the first chamber CH1.

The first passivation layer 501 covers an entirety of the top surface and the end portions of the first opposite electrode 401. The first passivation layer 501 may be deposited through a CVD process or an ALD process having excellent step coverage compared to step coverage of a PVD. In an embodiment, the first passivation layer 501 may be deposited through one of a thermal CVD, plasma CVD, metal-organic chemical vapor deposition ("MOCVD"), and hydride vapor phase epitaxy ("HVPE").

As a result of CVD or ALD, the first passivation layer 501 is stacked also on the first photoresist PR1. In addition, in a region where the first undercut profile UC1 is provided, the first passivation layer 501 is deposited also on the bottom surface of the first photoresist PR1, the top surface of the pixel-defining layer 110, and the lateral surface of the first lift-off layer LOL1.

Referring to FIG. 8, which is an enlarged view of a region VIII of FIG. 5D, around a region in which the first undercut profile UC1 has been provided, a thickness D2 of the first passivation layer 501 deposited on the bottom surface of the first photoresist PR1, the top surface of the pixel-defining layer 110, and the lateral surface of the first lift-off layer LOL1 is thinner than a thickness D1 of the first passivation layer 501 deposited on the top surface of the opposite electrode 401 and a thickness D3 of the first passivation layer 501 deposited on the top surface of the first lift-off layer LOL1.

Referring to FIG. 5E, a dry-etching process is performed on the structure of FIG. 5D. As a result of the dry-etching process, around the region in which the first undercut profile UC1 has been provided, the first passivation layer 501 is etched and removed.

Referring to FIG. 9, which is an enlarged view of a region IX of FIG. 5E, it is shown that the thickness of the first passivation layer 501 is reduced. A thickness D1' of the first passivation layer 501 deposited on the top surface of the first opposite electrode 401, and a thickness D3' of the first passivation layer 501 deposited on the top surface of the first lift-off layer LOL1 are reduced when compared to FIG. 8. Around the region in which the first undercut profile UC1 has been provided, a thickness D2' of the first passivation layer 501 deposited on the bottom surface of the first photoresist PR1, the top surface of the pixel-defining layer 110, and the lateral surface of the first lift-off layer LOL1 is reduced and completely removed when compared to the thickness before the dry-etching process is performed.

Figure 5F:
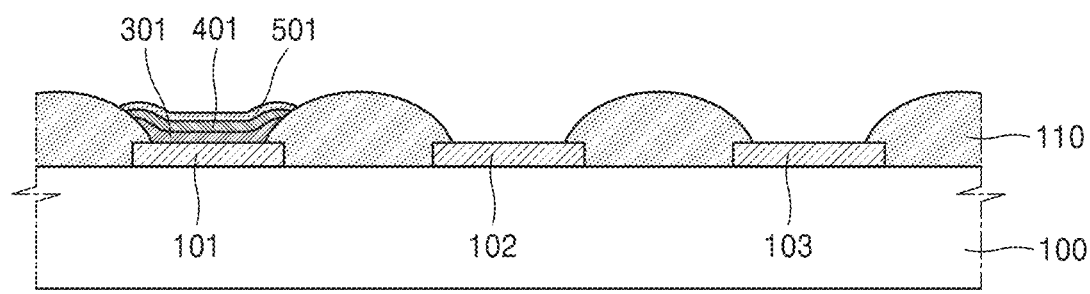

Referring to FIG. 5F, a lift-off process is performed on the structure of FIG. 5E. The lift-off process is performed outside the first chamber CH1. In an embodiment, the lift-off process may be performed in atmosphere at room temperature.

In the case where the first lift-off layer LOL1 includes a fluoropolymer, the first lift-off layer LOL1 may be removed by a second solvent including fluorine. Because the lift-off process is performed after the first intermediate layer 301 including the first emission layer (not shown) is provided, it is preferable that a material having low reactivity with the first intermediate layer 301 is used as the second solvent. Like the first solvent, the second solvent may include hydrofluoroether.

As a result of the lift-off, the first intermediate layer 301, the first opposite electrode 401, and the first passivation layer 501 arranged on the first pixel electrode 101 are left as patterns.

In the illustrated embodiment, because the first passivation layer 501 is provided through a deposition method having large step coverage, the first passivation layer 501 covers an entirety of the first opposite electrode 401, and thus, protects the first opposite electrode 401 and the first intermediate layer 301 that may be damaged during the lift-off process, which is a wet process.

As a result of performing a deposition process having large step coverage, the first passivation layer 501 deposited around the region in which the first undercut profile UC1 has been provided, for example, a region A1 (refer to FIG. 8) where the bottom surface of the first lift-off layer LOL1 meets the top surface of the pixel-defining layer 110 may be an obstacle to the lift-off process.

However, in the illustrated embodiment, the dry etching, which is an isotropic etching method, may be performed to remove the first passivation layer 501 in the relevant region A1, and then the lift-off process may be performed.

In addition, in the case where the dry-etching process is performed in the first chamber CH1 in which the deposition has been provided, damage to the organic light-emitting display apparatus 1 due to atmosphere and moisture outside the first chamber CH1 may be prevented. Though FIGS. 5D, 5E, 8, and 9 show the case where deposition and dry etching are performed in the same first chamber CH1, the invention is not limited thereto. The dry etching may be performed in a subsequent chamber (not shown) different from the first chamber CH1.

Hereinafter, a second unit process is described. The same descriptions as those of the first unit process may be omitted.

Referring to FIG. 6A, a second lift-off layer LOL2 and a second photoresist PR2 are sequentially disposed on the structure of FIG. 5F.

The second lift-off layer LOL2 may include the same material as that of the first lift-off layer LOL1. The second lift-off layer LOL2 may be provided through a method such as coating, printing, deposition, etc.

A second photoresist PR2 is disposed on the second lift-off layer LOL2. A portion of the second photoresist PR2 that corresponds to the second pixel electrode 102 is exposed through a second photo mask M2 including a light-transmissive portion M21 and a light-blocking portion M22.

Referring to FIG. 6B, the second photoresist PR2 is developed. A third opening C3 corresponding to the second pixel electrode 102 is defined in the developed second photoresist PR2.

Referring to FIG. 6C, the second lift-off layer LOL2 is etched by the patterned second photoresist PR2 of FIG. 6B as an etch mask.

In the case where the second lift-off layer LOL2 includes a fluoropolymer, a solvent that may etch a fluoropolymer is used as an etching liquid. In an embodiment, a first solvent may include hydrofluoroether, for example.

While the second lift-off layer LOL2 is etched during the etching process, a second undercut profile UC2 is disposed under the third opening C3 of the second photoresist PR2, and a fourth opening C4 that exposes the top surface of the second pixel electrode 102 and a portion of the pixel-defining layer 110 is defined by the first solvent including fluorine. The second undercut profile UC2 is provided, and thus, a wider deposition space may be secured on the second pixel electrode 102.

Referring to FIG. 6D, the second intermediate layer 302, the second opposite electrode 402, and the second passivation layer 502 are disposed on the structure of FIG. 6C. The second intermediate layer 302 includes a second emission layer (not shown).

The second intermediate layer 302, the second opposite electrode 402, and the second passivation layer 502 are provided through vacuum deposition. A deposition source (not shown) is arranged in a second chamber CH2, and deposition is performed by adjusting a deposition incidence angle such that a material emitted from the deposition source (not shown) is incident toward the substrate 100.

The second intermediate layer 302 may further include at least one of a hole injection layer, a hole transport layer, an electron transport layer, and an electron injection layer in addition to the second emission layer (not shown).

The second opposite electrode 402 may be a light-transmissive electrode or a reflective electrode. The second opposite electrode 402 covers the second intermediate layer 302, and thus, may serve as a protective layer that protects the second intermediate layer 302 that is vulnerable to moisture and oxygen.

The second passivation layer 502 covers an entirety of the top surface and the end portions of the second opposite electrode 402.

Like the first unit process, in an embodiment, the second intermediate layer 302 and the second opposite electrode 402 may be deposited through a PVD process, and the second passivation layer 502 may be deposited through a CVD process or an ALD process having excellent step coverage compared to step coverage of the PVD.

As a result of deposition, the second intermediate layer 302, the second opposite electrode 402, and the second passivation layer 502 are deposited on the top surface of the second pixel electrode 102 and a portion of the end portion of the pixel-defining layer 110 arranged in the fourth opening C4 and are stacked also on the second photoresist PR2.

In a region where the second undercut profile UC2 has been provided, the second passivation layer 502 is deposited on the bottom surface of the second photoresist PR2, the top surface of the pixel-defining layer 110, and the lateral surface of the second lift-off layer LOL2.

Referring to FIG. 6E, a dry-etching process is performed on the structure of FIG. 6D. As a result of the dry-etching process, around the region in which the second undercut profile UC2 has been provided, the second passivation layer 502 is etched and removed. That is, in the illustrated embodiment, the dry etching, which is an isotropic etching method, may be performed to remove the second passivation layer 502 in the relevant region A2, and then the lift-off process may be performed.

Referring to FIG. 6F, a lift-off process is performed on the structure of FIG. 6E. The lift-off process is performed outside the second chamber CH2. In an embodiment, the lift-off process may be performed in atmosphere at room temperature.

In the case where the second lift-off layer LOL2 includes a fluoropolymer, the second lift-off layer LOL2 may be removed by a second solvent including fluorine. Because the lift-off process is performed after the second intermediate layer 302 including the second emission layer (not shown) is provided, it is preferable that a material having low reactivity with the second intermediate layer 302 is used as the second solvent. Like the first solvent, the second solvent may include hydrofluoroether.

As a result of the lift-off, the second intermediate layer 302, the second opposite electrode 402, and the second passivation layer 502 arranged on the second pixel electrode 102 are left as patterns.

Though FIGS. 6D and 6E show the case where deposition and dry etching are performed in the same second chamber CH2, the invention is not limited thereto. The dry etching may be performed in a subsequent chamber (not shown) different from the second chamber CH2.

Hereinafter, a third unit process is described. The same descriptions as those of the first and second unit processes may be omitted.

Referring to FIG. 7A, a third lift-off layer LOL3 and a third photoresist PR3 are sequentially disposed on the structure of FIG. 6F.

The third lift-off layer LOL3 may include the same material as that of the first and second lift-off layers LOL1 and LOL2. The third lift-off layer LOL3 may be provided through a method such as coating, printing, deposition, etc.

A third photoresist PR3 is disposed on the third lift-off layer LOL3. A portion of the third photoresist PR3 that corresponds to the third pixel electrode 103 is exposed through a third photo mask M3 including a light-transmissive portion M31 and a light-blocking portion M32.

Referring to FIG. 7B, the third photoresist PR3 is developed. A fifth opening C5 corresponding to the third pixel electrode 103 is defined in the developed third photoresist PR3.

Referring to FIG. 7C, the third lift-off layer LOL3 is etched by the patterned third photoresist PR3 of FIG. 7B as an etch mask.

In the case where the third lift-off layer LOL3 includes a fluoropolymer, a solvent that may etch fluoropolymer is used as an etching liquid. A first solvent may include hydrofluoroether.

While the third lift-off layer LOL3 is etched during the etching process, a third undercut profile UC3 is disposed under the fifth opening C5 of the third photoresist PR3, and a sixth opening C6 that exposes the top surface of the third pixel electrode 103 and a portion of the pixel-defining layer 110 is defined by the first solvent including fluorine. The third undercut profile UC3 is provided, and thus, a wider deposition space may be secured on the third pixel electrode 103.

Referring to FIG. 7D, the third intermediate layer 303, the third opposite electrode 403, and the third passivation layer 503 are disposed on the structure of FIG. 7C. The third intermediate layer 303 includes a third emission layer (not shown).

The third intermediate layer 303, the third opposite electrode 403, and the third passivation layer 503 are provided through vacuum deposition. A deposition source (not shown) is arranged in a third chamber CH3, and deposition is performed by adjusting a deposition incidence angle such that a material emitted from the deposition source (not shown) is incident toward the substrate 100.

The third intermediate layer 303 may further include at least one of a hole injection layer, a hole transport layer, an electron transport layer, and an electron injection layer in addition to the third emission layer (not shown).

The third opposite electrode 403 may be a light-transmissive electrode or a reflective electrode. The third opposite electrode 403 covers the third intermediate layer 303, and thus, may serve as a protective layer that protects the third intermediate layer 303 that is vulnerable to moisture and oxygen.

The third passivation layer 503 covers an entirety of the top surface and the end portions of the third opposite electrode 403.

Like the first and second unit processes, in an embodiment, the third intermediate layer 303 and the third opposite electrode 403 may be deposited through a PVD process, and the third passivation layer 503 may be deposited through a CVD process or an ALD process having excellent step coverage compared to step coverage of the PVD.

As a result of deposition, the third intermediate layer 303, the third opposite electrode 403, and the third passivation layer 503 are deposited on the top surface of the third pixel electrode 103 and a portion of the end portion of the pixel-defining layer 110 arranged in the sixth opening C6 and are arranged also on the third photoresist PR3.

In a region where the third undercut profile UC3 has been provided, the third passivation layer 503 is deposited on the bottom surface of the third photoresist PR3, the top surface of the pixel-defining layer 110, and the lateral surface of the third lift-off layer LOL3.

Referring to FIG. 7E, a dry-etching process is performed on the structure of FIG. 7D. As a result of the dry-etching process, around the region in which the third undercut profile UC3 has been provided, the third passivation layer 503 is etched and removed. That is, in the illustrated embodiment, the dry etching, which is an isotropic etching method, may be performed to remove the third passivation layer 503 in the relevant region A3, and then the lift-off process may be performed.

Referring to FIG. 7F, a lift-off process is performed on the structure of FIG. 7E. The lift-off process is performed outside the third chamber CH3. In an embodiment, the lift-off process may be performed in atmosphere at room temperature.

In the case where the third lift-off layer LOL3 includes a fluoropolymer, the third lift-off layer LOL3 may be removed by a third solvent including fluorine. Because the lift-off process is performed after the third intermediate layer 303 including the third emission layer (not shown) is provided, it is preferable that a material having low reactivity with the third intermediate layer 303 is used as the third solvent. Like the first solvent, the third solvent may include hydrofluoroether.

As a result of the lift-off, the third intermediate layer 303, the third opposite electrode 403, and the third passivation layer 503 arranged on the third pixel electrode 103 are left as patterns.

Though FIGS. 7D and 7E show the case where deposition and dry etching are performed in the same third chamber CH3, the invention is not limited thereto. The dry etching may be performed in a subsequent chamber (not shown) different from the third chamber CH3.

The encapsulation member 700 (refer to FIG. 1) may be arranged on the first to third passivation layers 501, 502, and 503. The encapsulation member 700 may include at least one organic layer and at least one inorganic layer. FIG. 1 shows a structure in which the first inorganic layer 701, the organic layer 702, and the second inorganic layer 703 are sequentially stacked.

After the first to third unit processes are performed, the encapsulation member 700 (refer to FIG. 1) covering all of the top surfaces of the first to third passivation layers 501, 502, and 503 is arranged.

The encapsulation member 700 prevents moisture transmission, and thus, may prevent damage to an organic light-emitting element that is vulnerable to moisture in cooperation with the first to third passivation layers 501, 502, and 503.

As described above, in the illustrated embodiment, because the first to third passivation layers 501, 502, and 503 are provided through a deposition method having large step coverage, the first to third passivation layers 501, 502, and 503 cover an entirety of the first to third opposite electrodes 401, 402, and 403 and thus, protect the first to third opposite electrodes 401, 402, and 403 and the first to third intermediate layers 301, 302, and 303 that may be damaged during the lift-off process, which is a wet process.

Hereinafter, an organic light-emitting display apparatus 2 and a manufacturing method thereof according to another embodiment are described with reference to FIGS. 10 to 12F.

Figure 10:
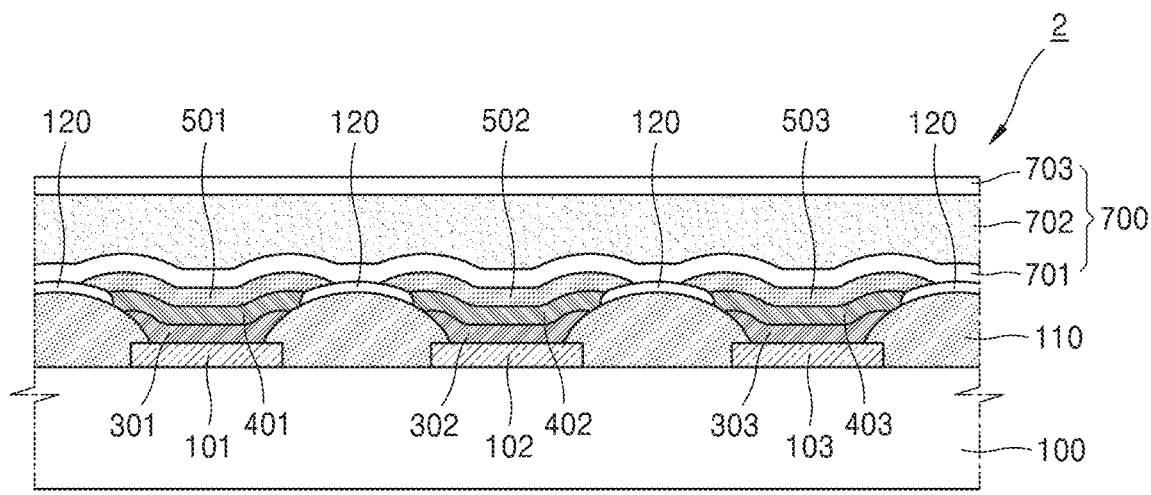
FIG. 10 is a cross-sectional view of another embodiment of an organic light-emitting display apparatus.
Figure 11:
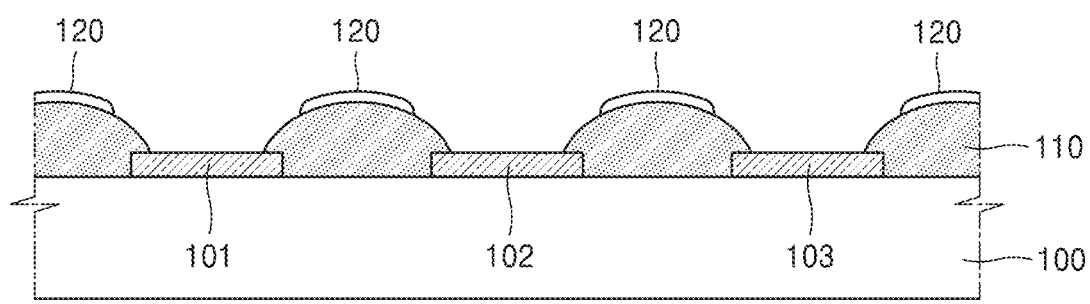
FIG. 11 is a cross-sectional view showing another embodiment of an operation of forming first to third pixel electrodes, an auxiliary electrode, and a pixel-defining layer on a substrate of an organic light-emitting display apparatus.

FIG. 10 is a cross-sectional view of the organic light-emitting display apparatus 2 according to another embodiment, FIG. 11 is a cross-sectional view showing an operation of forming the first to third pixel electrodes 101, 102, and 103, an auxiliary electrode 120, and the pixel-defining layer 110 on the substrate 100 of the organic light-emitting display apparatus 2 according to another embodiment, and FIGS. 12A to 12F are cross-sectional views of a first unit process of the organic light-emitting display apparatus 2.

Referring to FIG. 10, in the organic light-emitting display apparatus 2 according to another embodiment, a plurality of pixel electrodes is apart from each other on the substrate 100, the plurality of pixel electrodes including the first pixel electrode 101, the second pixel electrode 102, and the third pixel electrode 103. The pixel-defining layer 110 covers the end portions of the plurality of first to third pixel electrodes 101, 102, and 103, prevents electric field concentration to an end portion of each pixel electrode, and defines an emission area.

Unlike the previous embodiment, in the illustrated embodiment, the auxiliary electrode 120 is arranged on the pixel-defining layer 110 such that the auxiliary electrode 120 is apart from the first to third pixel electrodes 101, 102, and 103.

The first to third intermediate layers 301, 302, and 303 including the first to third emission layers (not shown) are respectively arranged on the first to third pixel electrodes 101, 102, and 103. The first to third opposite electrodes 401, 402, and 403 are respectively arranged on the first to third intermediate layers 301, 302, and 303.

The first to third pixel electrodes 101, 102, and 103, the first to third intermediate layers 301, 302, and 303, and the first to third opposite electrodes 401, 402, and 403 may each have an island shaped pattern.

In the illustrated embodiment, the first to third opposite electrodes 401, 402, and 403 may respectively extend on the pixel-defining layer 110 to contact the auxiliary electrode 120.

Though not shown in the drawing, the auxiliary electrode 120 is electrically connected to a common power voltage and applies the common power voltage to the first to third opposite electrodes 401, 402, and 403 each contacting the auxiliary electrode 120. When a driving current is transferred from a driving thin-film transistor (not shown) to the first to third pixel electrodes 101, 102, and 103, and the common power voltage is applied to the first to third opposite electrodes 401, 402, and 403 through the auxiliary electrode 120, the first to third emission layers (not shown) emit light.

The first to third passivation layers 501, 502, and 503 are arranged on the first to third opposite electrodes 401, 402, and 403.

The first passivation layer 501 covers an entirety of the first opposite electrode 401 and extends on the auxiliary electrode 120, and thus, the end portion of the first passivation layer 501 contacts the top surface of the auxiliary electrode 120. The second passivation layer 502 covers an entirety of the second opposite electrode 402 and extends on the auxiliary electrode 120, and thus, the end portion of the second passivation layer 502 contacts the top surface of the auxiliary electrode 120. The third passivation layer 503 covers an entirety of the third opposite electrode 403 and extends on the auxiliary electrode 120, and thus, the end portion of the third passivation layer 503 contacts the top surface of the auxiliary electrode 120.

The first to third passivation layers 501, 502, and 503 respectively cover an entirety of the first to third intermediate layers 301, 302, and 303 and the first to third opposite electrodes 401, 402, and 403, and thus, prevent a damage to the organic light-emitting element during a patterning process.

Like the previous embodiment, in the illustrated embodiment, the first to third pixel electrodes 101, 102, and 103 are apart from each other in an island shape. The first to third intermediate layers 301, 302, and 303 may be arranged thereon in an island shape. In addition, like the previous embodiment, the first to third passivation layers 501, 502, and 503 covering the first to third opposite electrodes 401, 402, and 403 may be arranged in an island shape.

The encapsulation member 700 covering all of the top surfaces of the first to third passivation layers 501, 502, and 503 and the auxiliary electrode 120 is arranged.

The encapsulation member 700 may include at least one organic layer and at least one inorganic layer. FIG. 10 shows a structure in which the first inorganic layer 701, the organic layer 702, and the second inorganic layer 703 are sequentially stacked.

Differences between a process of the illustrated embodiment and the process of the previous embodiment are mainly described.

Referring to FIG. 11, the plurality of pixel electrodes including the first pixel electrode 101, the second pixel electrode 102, and the third pixel electrode 103 are provided, the pixel-defining layer 110 covering the end portions of the first to third pixel electrodes 101, 102, and 103 is provided, and an auxiliary electrode 120 is disposed on the pixel-defining layer 110. Patterning of the first to third pixel electrodes 101, 102, and 103, the pixel-defining layer 110, and the auxiliary electrode 120 may be performed through a photolithography process.

Figure 12A:
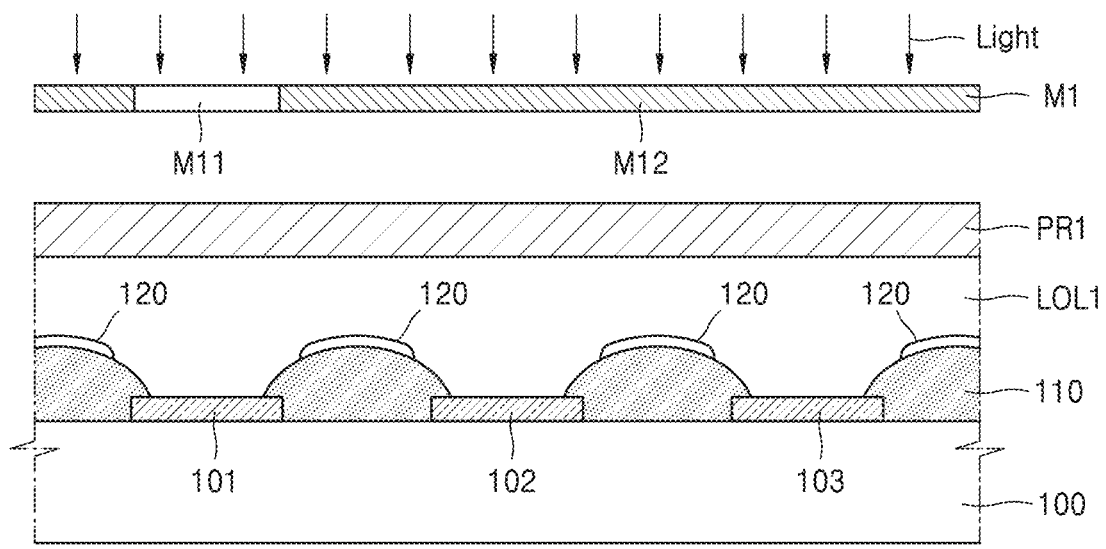
FIGS. 12A to 12F are cross-sectional views showing another embodiment of a first unit process for an organic light-emitting display apparatus.

Referring to FIG. 12A, the first lift-off layer LOL1 and the first photoresist PR1 are sequentially disposed on the structure of FIG. 11.

The first lift-off layer LOL1 may be provided through methods such as coating, printing, and deposition.

The first photoresist PR1 is disposed on the first lift-off layer LOL1. A portion of the first photoresist PR1 that corresponds to the first pixel electrode 101 is exposed through a first photo mask M1 including a light-transmissive portion M11 transmitting light L and a light-blocking portion M12 blocking the light L.

Figure 12B:
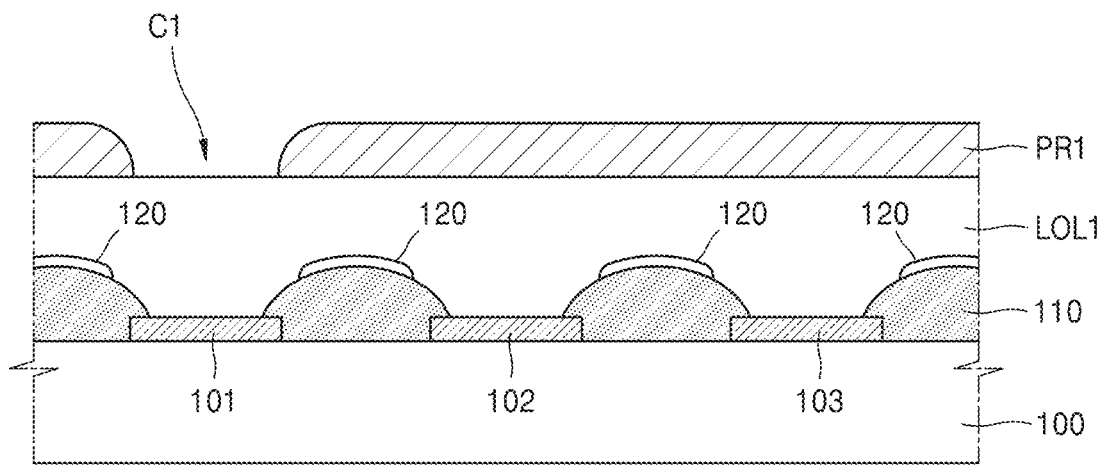

Referring to FIG. 12B, the first photoresist PR1 is developed. The first opening C1 corresponding to the first pixel electrode 101 is defined in the developed first photoresist PR1.

Figure 12C:
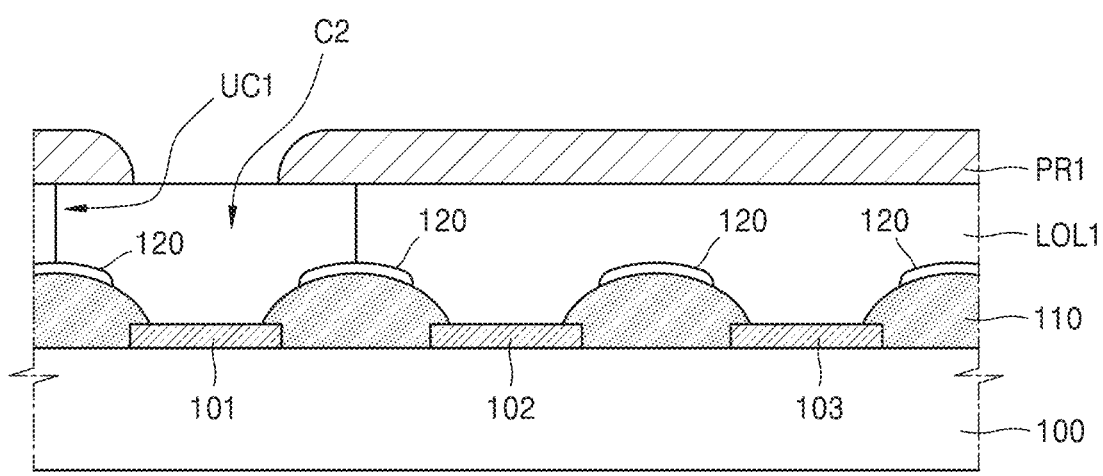

Referring to FIG. 12C, the first lift-off layer LOL1 is etched by the patterned first photoresist PR1 of FIG. 12B as an etch mask.

In the case where the first lift-off layer LOL1 includes fluoropolymer, a solvent that may etch fluoropolymer is used as an etching liquid. The first solvent may include hydrofluoroether.

While the first lift-off layer LOL1 is etched during the etching process, a first undercut profile UC1 is provided under the first opening C1 of the first photoresist PR1, and the second opening C2 that exposes the top surface of the first pixel electrode 101, a portion of the auxiliary electrode 120, and a portion of the pixel-defining layer 110 is defined by the first solvent including fluorine. The first undercut profile UC1 is provided, and thus, a wider deposition space may be secured on the first pixel electrode 101.

Figure 12D:
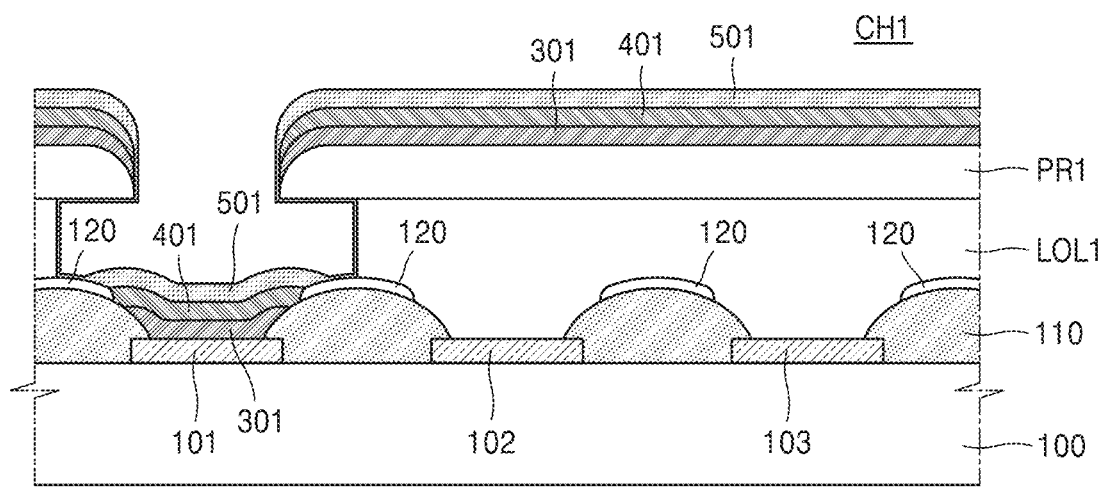

Referring to FIG. 12D, the first intermediate layer 301, the first opposite electrode 401, and the first passivation layer 501 are disposed on the structure of FIG. 12C. The first intermediate layer 301 includes the first emission layer (not shown). In an embodiment, the first intermediate layer 301 may further include at least one of a hole injection layer, a hole transport layer, an electron transport layer, and an electron injection layer.

The first intermediate layer 301, the first opposite electrode 401, and the first passivation layer 501 are provided through vacuum deposition. A deposition source (not shown) is arranged in the first chamber CH1, and deposition is performed by adjusting a deposition incidence angle such that a deposition material emitted from the deposition source (not shown) is incident toward the substrate 100.

The first intermediate layer 301 is stacked on the top surface of the first pixel electrode 101 and a portion of the pixel-defining layer 110.

The first opposite electrode 401 is stacked to contact the top surfaces of the first intermediate layer 301, the pixel-defining layer 110, and the auxiliary electrode 120.

The first passivation layer 501 is stacked to contact the top surfaces of the first opposite electrode 401 and the auxiliary electrode 120.

Like the previous embodiment, in an embodiment, the first intermediate layer 301 and the first opposite electrode 401 may be deposited through a PVD process, and the first passivation layer 501 may be deposited through a CVD process or an ALD process having an excellent step coverage compared to step coverage of the PVD.

As a result of deposition, the first intermediate layer 301, the first opposite electrode 401, and the first passivation layer 501 are deposited on the top surface of the first pixel electrode 101 arranged in the second opening C2 and are stacked also on the first photoresist PR1.

In a region where the first undercut profile UC1 has been provided, the first passivation layer 501 is deposited on the bottom surface of the first photoresist PR1, the top surface of the auxiliary electrode 120, and the lateral surface of the first lift-off layer LOL1.

Figure 12E:
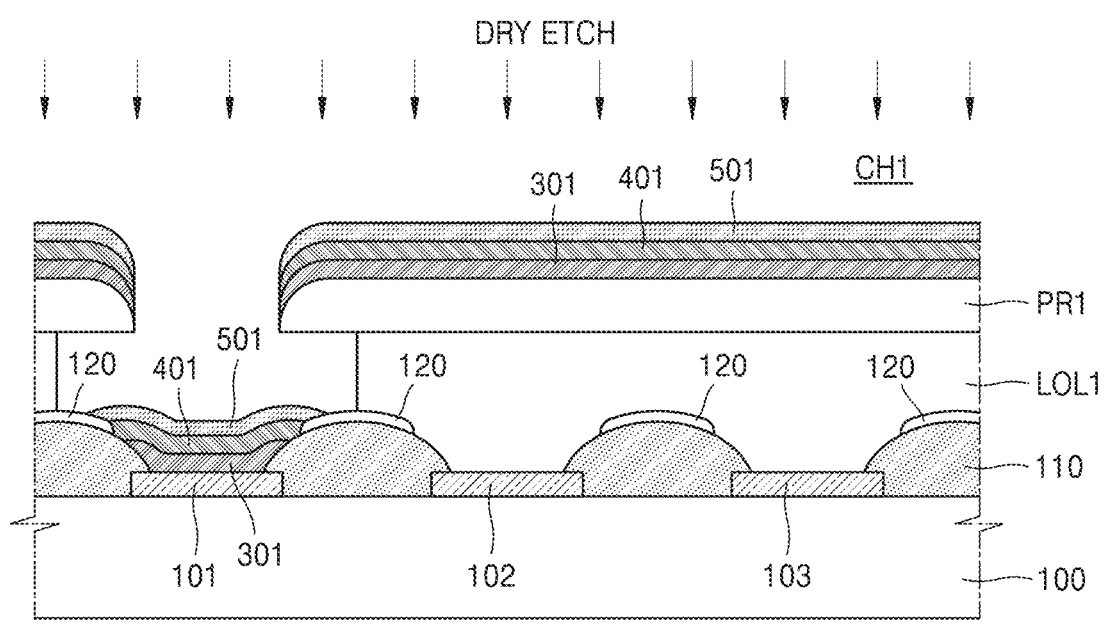

Referring to FIG. 12E, a dry-etching process is performed on the structure of FIG. 12D. As a result of the dry-etching process, around the region in which the first undercut profile UC1 has been provided, the first passivation layer 501 is etched and removed.

Figure 12F:
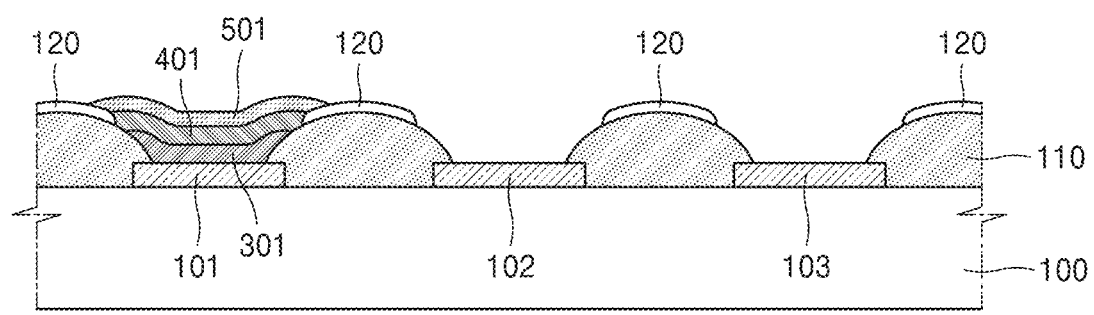

Referring to FIG. 12F, a lift-off process is performed on the structure of FIG. 12E. The lift-off process is performed outside the first chamber CH1. In an embodiment, the lift-off process may be performed in atmosphere at room temperature.

As a result of the lift-off, the first intermediate layer 301 is arranged on the first pixel electrode 101. The first opposite electrode 401 covering the first intermediate layer 301 contacts the auxiliary electrode 120 arranged on the pixel-defining layer 110. The first passivation layer 501 covering the first opposite electrode 401 and a portion of the auxiliary electrode 120 is left.

Though FIGS. 12D and 12E show the case where deposition and dry etching are performed in the same first chamber CH1, the invention is not limited thereto. The dry etching may be performed in a subsequent chamber (not shown) different from the first chamber CH1.

Compared to the previous embodiment, the first opposite electrode 401 is connected to the auxiliary electrode 120, and thus, reduces the resistance of a common electrode.

In the illustrated embodiment, like the previous embodiment, a full-color organic light-emitting display apparatus may be manufactured by forming the intermediate layer, the opposite electrode, and the passivation layer also on the second pixel electrode 102 and the third pixel electrode 103 through the second and third unit processes. Since a process similar to the previous embodiment is repeated, descriptions thereof are omitted.

As described above, in the organic light-emitting display apparatus 2 in the illustrated embodiment, because the passivation layer is provided through a deposition method having large step coverage, the passivation layer covers an entirety of the opposite electrode, and thus, protects the intermediate layer and the opposite electrode during a lift-off process. Dry etching is performed in the same chamber, and thus, damage due to atmosphere and moisture outside the chamber may be prevented. In addition, the auxiliary electrode is provided, and thus, a voltage drop of the common electrode may be prevented.

Although the invention has been described with reference to an embodiment shown in the drawings, this is provided as a descriptive sense only, and it will be understood by those of ordinary skill in the art that various changes in form and details may be made therefrom.

The invention claimed is:

1. A method of manufacturing an organic light-emitting display apparatus, the method comprising:
    forming a pixel electrode and a pixel-defining layer on a substrate such that the pixel-defining layer covers edges of the pixel electrode;
    sequentially forming a lift-off layer and a photoresist on the pixel electrode and the pixel-defining layer;
    patterning the lift-off layer and the photoresist to define an opening which exposes a first surface of the pixel electrode and a portion of the pixel-defining layer, the first surface of the pixel electrode being opposite to a second surface of the pixel electrode facing the substrate;
    sequentially forming an intermediate layer and an opposite electrode in the opening and on the photoresist, the intermediate layer including an emission layer;
    forming a passivation layer, after the patterning the lift-off layer and the photoresist, to cover an entirety of a first surface and end portions of the opposite electrode, the first surface of the opposite electrode being opposite to a second surface of the opposite electrode facing the substrate; and
    removing the lift-off layer and the photoresist which remain outside the opening,
    wherein after the forming the passivation layer, dry etching is performed so that a portion of the passivation layer is etched.

2. The method of claim 1, wherein the patterning the photoresist comprises a photolithography process.

3. The method of claim 1, wherein the lift-off layer includes a fluoropolymer.

4. The method of claim 3, wherein the opening is formed by etching the lift-off layer using a first solvent including fluorine.

5. The method of claim 1, wherein the forming the intermediate layer comprises a first deposition process,
    the forming the opposite electrode comprises a second deposition process, and
    the forming the passivation layer comprises a third deposition process to make a step coverage over the passivation layer greater than a step coverage over the intermediate layer and the opposite electrode.

6. The method of claim 5, wherein the first deposition process comprises a physical vapor deposition process.

7. The method of claim 5, wherein the second deposition process comprises a physical vapor deposition process.

8. The method of claim 5, wherein the third deposition process comprises a chemical vapor deposition process or an atomic layer deposition process.

9. The method of claim 5, wherein the first to third deposition processes are performed in a same chamber.

10. The method of claim 5, wherein, after the third deposition process, the dry etching is performed inside a same chamber as a chamber in which the third deposition process is performed or a chamber different from the chamber in which the third deposition process is performed.

11. The method of claim 10, wherein a first surface of the pixel-defining layer opposite to a second surface of the pixel-defining layer facing the substrate is exposed through the dry etching.

12. The method of claim 1, further comprising:
forming an auxiliary electrode on the pixel-defining layer, wherein the opposite electrode is formed to contact the auxiliary electrode.

13. The method of claim 12, wherein, after the forming the passivation layer, the dry etching is performed in a same chamber as a chamber in which the passivation layer is formed or a chamber different from the chamber in which the passivation layer is formed, and
a first surface of the auxiliary electrode opposite to a second surface of the auxiliary electrode facing the substrate is exposed through the dry etching.

14. The method of claim 1, wherein the lift-off layer which remains is removed by a second solvent including fluorine.

15. The method of claim 1, wherein the intermediate layer, the opposite electrode, and the passivation layer are vacuum-deposited in a chamber, and
the removing the lift-off layer is performed in atmosphere outside the chamber.

16. The method of claim 15, wherein the passivation layer is exposed in a wet process of removing the lift-off layer while the passivation layer covers an entirety of the first surface and the end portions of the opposite electrode.

17. A method of manufacturing an organic light-emitting display apparatus, the method comprising:
after forming first and second pixel electrodes on a substrate, and forming a pixel-defining layer which covers end portions of the first and second pixel electrodes, performing a first unit operation including:
sequentially forming a first lift-off layer and a first photoresist on the first and second pixel electrodes and the pixel-defining layer;
patterning the first lift-off layer and the first photoresist to define a first opening which exposes a first surface of the first pixel electrode and a portion of the pixel-defining layer, the first surface of the first pixel electrode being opposite to a second surface of the first pixel electrode facing the substrate;
sequentially forming a first intermediate layer and a first opposite electrode in the first opening and on the first photoresist, the first intermediate layer including a first emission layer;
forming a first passivation layer, after the patterning the lift-off layer and the photoresist, to cover a first surface and end portions of the first opposite electrode, the first surface of the first opposite electrode being opposite to a second surface of the first opposite electrode facing the substrate; and
removing the first lift-off layer and the first photoresist which remain outside the first opening; and
after the first unit operation, performing a second unit operation including:
sequentially forming a second lift-off layer and a second photoresist on the first passivation layer, the second pixel electrode, and the pixel-defining layer;
patterning the second lift-off layer and the second photoresist to define a second opening which exposes a first surface of the second pixel electrode and a portion of the pixel-defining layer, the first surface of the second pixel electrode being opposite to a second surface of the second pixel electrode facing the substrate;
sequentially forming a second intermediate layer and a second opposite electrode in the second opening and on the second photoresist, the second intermediate layer including a second emission layer;
forming a second passivation layer to cover an entirety of a first surface and end portions of the second opposite electrode, the first surface of the second opposite electrode being opposite to a second surface of the second opposite electrode facing the substrate; and
removing the second lift-off layer and the second photoresist which remain outside the second opening,
wherein after the forming the first passivation layer, dry etching is performed so that a portion of the first passivation layer is etched.

18. The method of claim 17, wherein a color emitted from the first emission layer is different from a color emitted from the second emission layer.

19. The method of claim 17, wherein the first intermediate layer, the first opposite electrode, and the first passivation layer are formed in a first chamber.

20. The method of claim 19, further comprising, after the forming the first passivation layer, performing the dry etching in the first chamber.

21. The method of claim 19, further comprising, after the forming the first passivation layer, performing the dry etching in a subsequent chamber different from the first chamber.

22. The method of claim 17, wherein the first intermediate layer and the second intermediate layer further include at least one of a hole injection layer, a hole transport layer, an electron transport layer, and an electron injection layer.

23. The method of claim 17, further comprising:
forming an encapsulation member sequentially arranged on the first passivation layer and the second passivation layer and including at least one organic layer and at least one inorganic layer.

24. An organic light-emitting display apparatus comprising:
first and second pixel electrodes apart from each other on a substrate;
a pixel-defining layer covering end portions of the first and second pixel electrodes;
an auxiliary electrode on the pixel-defining layer;
first and second intermediate layers respectively including first and second emission layers arranged as islands on the first and second pixel electrodes;
first and second opposite electrodes respectively arranged in island patterns on the first and second intermediate layers, disposed in an opening defined in the auxiliary electrode, and contacting the auxiliary electrode;
first and second passivation layers respectively arranged in island patterns on the first and second opposite electrodes and covering an entirety of the first and second opposite electrodes; and
an encapsulation member covering the first and second passivation layers.

25. The apparatus of claim 24, wherein the first passivation layer and the second passivation layer each include a nitride-based material.

* * * * *